US006352592B1

(12) United States Patent
Bartholomew et al.

(10) Patent No.: US 6,352,592 B1
(45) Date of Patent: *Mar. 5, 2002

(54) FREE FLOATING SHIELD AND SEMICONDUCTOR PROCESSING SYSTEM

(75) Inventors: Lawrence Duane Bartholomew, Felton; Jay Brian DeDontney, Santa Cruz; Christopher A. Peabody, Menlo Park, all of CA (US)

(73) Assignee: Silicon Valley Group, Thermal Systems LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/492,420

(22) Filed: Jan. 27, 2000

Related U.S. Application Data

(63) Continuation-in-part of application No. 09/185,180, filed on Nov. 3, 1998, now Pat. No. 6,056,824, which is a continuation-in-part of application No. 09/008,024, filed on Jan. 16, 1998, now Pat. No. 5,849,088.

(51) Int. Cl.$^7$ .............................................. C23C 16/00
(52) U.S. Cl. ..................... 118/719; 118/715; 118/729
(58) Field of Search ................................ 118/715, 719, 118/729

(56) References Cited

U.S. PATENT DOCUMENTS

| 4,834,020 A | 5/1989 | Bartholomew et al. ..... 118/719 |
| 5,487,784 A | 1/1996 | Ellis, Jr. ..................... 118/718 |
| 5,849,088 A | 12/1998 | DeDontney et al. ........ 118/719 |
| 5,851,293 A | 12/1998 | Lane et al. ................. 118/715 |
| 5,944,900 A | 8/1999 | Tran ............................ 118/715 |

Primary Examiner—Richard Bueker
(74) Attorney, Agent, or Firm—Flehr Hohbach Test Albritton & Herbert LLP

(57) ABSTRACT

A protective shield and a semiconductor processing system including a protective shield is provided. The shield includes a frame assembly including a pair of spaced end walls and a pair of side walls extending between and mounted to the end walls, and a plurality of shield bodies carried by the frame assembly. Each of the shield bodies includes a base having a continuous unit frame, a perforated sheet carried by said continuous frame, a plenum between the base and the perforated sheet, and a gas delivery device for delivering an inert gas to the plenum at a flow rate such that the gas diffuses through the perforated sheet. The chemical vapor deposition system includes a plurality of processing chambers, a conveyor for transporting substrates through the processing chambers, buffer modules isolating the processing chambers from the rest of the process path all enclosed within a muffle, a protective shield mounted in the processing chambers includes injector shield bodies positioned adjacent the injector and shunt shield bodies spaced from the injector shield bodies, an inlet port between the injector shield bodies, and an outlet port between the shunt shield bodies for the flow of reagents through the protective shield. The shunt shield bodies each include a plenum filled with an inert gas and a bottom outlet port coupled to the plenum for delivering a supply of inert gas below the protective shield to form buffer barriers on opposite sides of the injection ports. The shield body captures the perforated sheets and shield bodies such that the sheets and shield body base can freely expand and contract relative to each other and the end walls under varying temperature conditions, maintaining the precise chamber geometry control required for CVD processing. The buffer modules are connected to a common by-pass exhaust which is independent from the system. The processing chambers are connected to a common chamber exhaust plenum which is separate from the by-pass exhaust. Such separate exhaust paths allow for separate control of each and for the substantially constant flow of gases within the system.

24 Claims, 27 Drawing Sheets

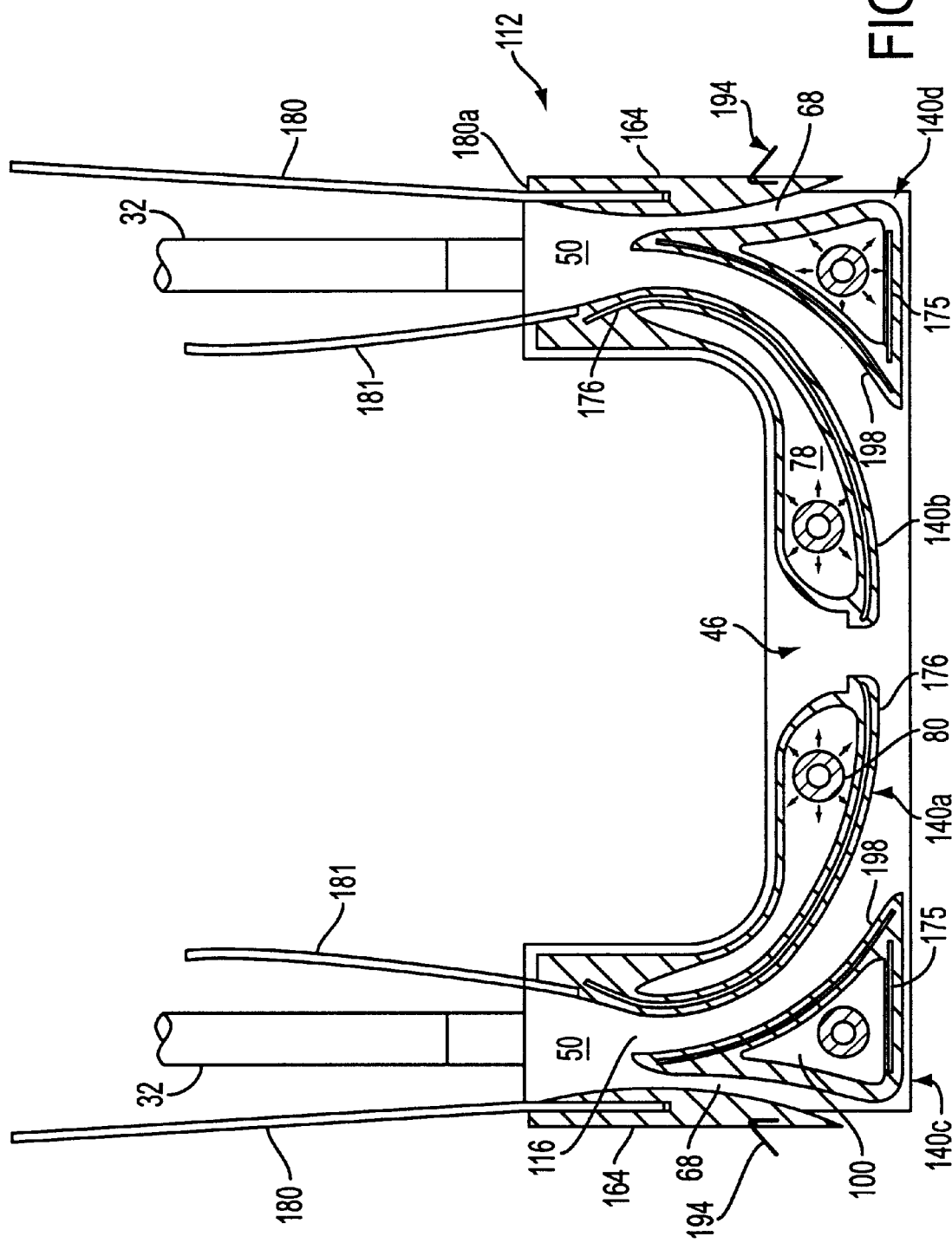

FREE FLOATING SHIELD AND SEMICONDUCTOR PROCESSING SYSTEM

RELATED APPLICATIONS

This is a continuation-in-part application of U.S. patent application Ser. No. 09/185,180 filed on Nov. 3, 1998, now U.S. Pat. No. 6,056,824 the entire disclosure of which is incorporated herein by reference, which application is a continuation-in-part of U.S. patent application Ser. No. 09/008,024, filed on Jan. 16, 1998, now U.S. Pat. No. 5,849,088 Issued Dec.15, 1998, the entire disclosure of which is incorporated herein by reference.

BRIEF DESCRIPTION OF THE INVENTION

The present invention relates in general to a protective shield for chemical vapor deposition systems and, more particularly, to a gas shield for reducing film deposition on the processing equipment. Additionally, the present invention relates to a semiconductor processing system employing a protective shield and utilizing exhaust control.

BACKGROUND OF THE INVENTION

Chemical vapor deposition (CVD) systems are used to form a thin, uniform layer or film on a substrate such as a semiconductor silicon. During CVD processing, the substrate is exposed to one or more gaseous substances such as silane, phosphane, diborane, oxygen, ozone and the like, and chemical vapors such as TEOS (tetraethylorthosilicate), TMB (trimethylborate), TMPi (trimethylphosphite), TEB (trimethylborate), TEPo (triethylphospate) and the like. The gases are injected into a clean, isolated reaction chamber and allowed to mix and interact with the other gases and/or the surface of the substrate to produce the desired film. The CVD systems typically employ injectors which deliver the gaseous substances directly to the surface of the substrate. An exhaust system removes waste products, such as unreacted gases and powders formed during the reaction, from the reaction chamber. Over time, films are deposited on the exposed surfaces of the chamber creating sources of particulate contamination which may become embedded in the film or degrade film uniformity. In many applications including semiconductor processing, film characteristics such as purity and thickness uniformity must meet high quality standards. To preserve film quality and prevent unacceptable defect levels, the reaction chamber must be cleaned to remove the deposited films.

The injection ports are typically positioned less than one inch from the surface of the substrate. With this limited clearance between the injector and the substrate surface, the surfaces of the injector and chamber walls will become coated with the material produced during the reactions. To reduce the amount of build-up in this area, some CVD systems include shields which are positioned in front of the injectors and exhaust port. The shields include a perforated screen welded to a support body. Supply tubes deliver an inert gas such as nitrogen to the volume between the support body and the screen. The nitrogen exits the shield through the perforated screen to slow the rate at which materials accumulate on the shield during processing.

The desired reactions for chemical vapor deposition typically occur at elevated temperatures, for example 300° C. to 600° C., with the substrate and chamber being heated to the appropriate temperature for a selected process. The high temperatures in the reaction chamber create thermal stresses in the perforated screen which may cause the screen to buckle after a period of time. The thermal deformation of the perforated screen disrupts the uniform flow of nitrogen through the screen, leaving portions of the screen unprotected against the accumulation of deposition materials. The ability of the screen to deliver nitrogen to the reaction chamber is further reduced as the screen becomes coated with deposition materials, requiring removal and cleaning or replacement of the shield. Since the screen essentially defines an upper "wall" of the reaction chamber, the deformed screen also interferes with the uniformity and distribution of the process reactant chemistries within the reaction chamber. The delays created by removal of the shield for cleaning or the replacement of a damaged shield are time consuming and expensive. A shield in which thermal deformation of the screen is minimized or eliminated is desirable. A shield which provides a uniform supply of the inert gas to the reaction chamber is also desirable. A shield in which a damaged screen surface can be quickly and inexpensively replaced is similarly desirable.

For atmospheric pressure CVD (APCVD) processing, the substrates are transported during processing by a conveyor which carries the substrates through one or more reaction chambers. The reaction chamber is not an enclosed chamber, but is merely the area in front of the injector between a series of curtains which use an inert gas such as nitrogen to isolate the reaction chamber from the rest of the process path. The exhaust vents on either side of the injector are used to extract unused gases and reaction by-products from the reaction chamber. If the exhaust is extracted at a rate slower than the rate at which the gases are introduced to the reaction chamber, some of the reactants may escape from the reaction chamber. Thus, with prior art systems the flow rate of the exhaust is typically greater than the rate at which gases are injected into the chamber, with excess inert gas being drawn into the reaction chamber from the area between the reaction chambers to provide a buffer zone blocking the escape of reactant gases. However, the gas drawn into the chamber from the adjacent buffer zones is not uniformly metered across the width of the reaction chamber. Thus, a non-uniform gas-to-gas boundary is created along the width of the reaction chamber. A shield which effectively prevented the escape of reactant gases from the reaction chamber without interfering with the reaction chemistries is desirable. As gases are pulled into the exhaust vent from the area below the injector on one side of the vent and the buffer zone between the reaction chambers on the other side of the vent, a large volume of reactant gas recirculation is created between the opposing flow streams. A shield which efficiently exhausts reactant gases from the chamber and minimizes the amount of gas recirculation within the reaction chamber is desirable.

OBJECTS AND SUMMARY OF THE INVENTION

It is a primary object of the present invention to provide a shield assembly for protecting the exposed surfaces of a gas injector, chamber wall, or exhaust vent used in CVD processing.

It is a further object of the present invention to provide a shield assembly which uniformly delivers an inert gas to surfaces of the shield assembly during extended use of the shield assembly, and allows use of a smooth undistorted surface shape.

It is another object of the present invention to provide a shield assembly which will withstand the high temperatures necessary for the chemical reactions occurring within the chamber, without gas leakage or deformation of the shield assembly or surface delivering protective gas flow.

It is yet another object of the present invention to provide a shield assembly with removable and replaceable screens.

It is another object of the present invention to provide a shield assembly which provides separate dual exhaust paths for reactant gases and by-products versus ambient gas drawn into the chamber.

It is still another object of the present invention to provide a shield assembly which creates an inert gas buffer zone preventing the escape of reactant gases from the chamber.

It is another object of the present invention to provide a shield assembly which can supply excess inert gas to flow out of the chamber instead of requiring adjacent ambient gas to be drawn into the chamber in order to prevent the escape of reactant gases from the chamber in an open APCVD system.

It is an additional object of the present invention to provide a shield assembly which minimizes recirculation of the reactant gases within the chamber while protecting the exhaust vent path surfaces.

Another object of the present invention is to provide a shield assembly allowing a new muffle design having APCVD process modules or chambers isolated by buffer modules which extract excess inert gas from the chambers rather than supply excess gas drawn into the process chambers.

A more general object of the present invention is to provide a shield assembly which has a prolonged useful life, reducing the maintenance costs and maximizing the operational time of the CVD system, and which may be economically and efficiently manufactured and maintained.

It is a further object of the present invention to provide a shield assembly that is constructed of a base having a continuous unit frame for easy, yet secure, insertion of a sheet or screen.

In summary, this invention provides a durable protective shield for protecting the CVD equipment from excess film deposition and safely isolating the reaction chamber from the remainder of the process path. The shield includes a frame assembly including a pair of spaced end walls and a pair of side walls extending between and mounted to the end walls. A plurality of shield bodies are carried by the frame assembly, including injector shield bodies positioned for protection against injected reagents from the injector and shunt shield bodies spaced from the injector shield bodies for protection against exhausted reagents. Each of the shield bodies include a base, a perforated sheet carried by the base, a plenum between the base and the perforated sheet, and a gas delivery device for delivering an inert gas to the plenum at a flow rate such that the gas diffuses through the perforated sheet. In one aspect of the invention, the shield bodies are captured within the frame assembly such that the shield bodies can freely expand and contract relative to the frame assembly under varying temperature conditions. In another aspect of the invention, the perforated sheets are captured by the shield body base and end walls such that the sheets can freely expand and contract relative to the base and end walls under varying temperature conditions, maintaining the precise geometry requirements for CVD films. In another aspect of the invention, the shunt shield bodies each include an outlet port for supplying inert gas to areas below the shield to form buffer zones of inert gas on either side of the deposition zone within the processing chamber.

The invention also includes an atmospheric pressure chemical vapor deposition system which includes a plurality of processing chambers each having an injector therein for injecting reagents into the processing chamber and exhaust vents positioned on opposite sides of the injector. A conveyor transports substrates through the processing chambers along a process path. A plurality of buffer chambers isolate the processing chambers from the rest of the process path. A muffle encloses the processing chambers, the buffer chambers and the process path of the conveyor, and includes by-pass ducts for venting the buffer chambers of muffle. A protective shield is mounted in the processing chambers for protecting the surface of the injector and the inlets of the exhaust ports. The protective shield includes injector shield bodies positioned adjacent the injector and shunt shield bodies spaced from the injector shield bodies. The shield includes an inlet port between the injector shield bodies and an outlet port between the shunt shield bodies for the flow of reagents through the protective shield. The shunt shield bodies each include a plenum filled with an inert gas and a bottom outlet port coupled to the plenum for delivering a supply of inert gas below the protective shield to form buffer barriers on opposite sides of the injection ports. This APCVD system configuration is novel in that the new protective shield can supply excess inert gas from within the processing chambers such that all flow within the buffer chambers exits the muffle through by-pass ducts instead of being drawn into the chamber process exhaust vents.

In a new embodiment of the present invention, a protective shield for gas distribution systems is provided that includes a frame assembly including a pair of spaced end walls and a pair of side walls extending between and mounted to the end walls. A plurality of unit shield bodies carried by said frame assembly are provided. Each of the unit shield bodies is formed of a single piece base and the base has a unit frame formed around the perimeter of the base, a perforated sheet carried by said unit frame, a plenum partially defined by the base and the perforated sheet, and a gas delivery device for delivering an inert gas to the plenum at a flow rate such that the gas diffuses through the perforated sheet.

Additional objects and features of the invention will be more readily apparent from the following detailed description and appended claims when taken in conjunction with the drawings.

BRIEF DESCRIPTION OF THE DRAWINGS

FIG. 16 is a cross-sectional view of a shield assembly in accordance with another embodiment of the invention.

FIG. 20b is a front plan view of the outside of the end wall of FIG. 20a.

DETAILED DESCRIPTION OF THE INVENTION

Figure 1:
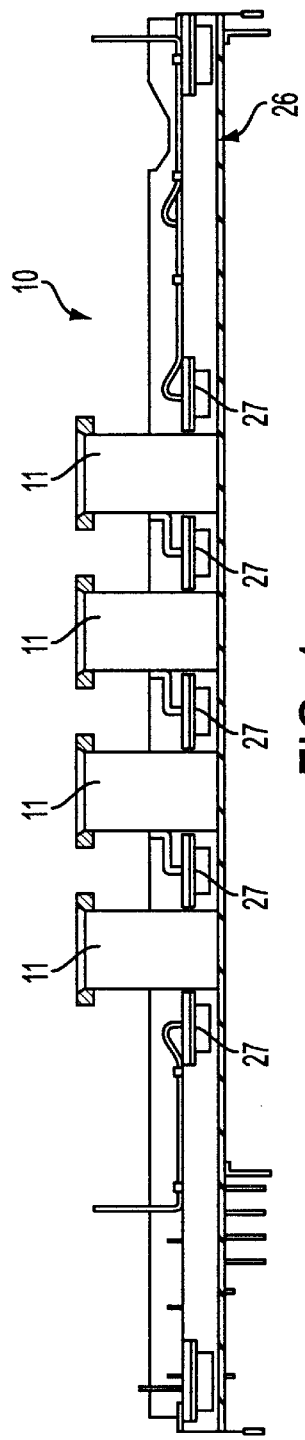
FIG. 1 is a schematic view of an existing prior art (APCVD) processing system which can incorporate a new protective shield in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIGS. 1 and 2.

Figure 2:
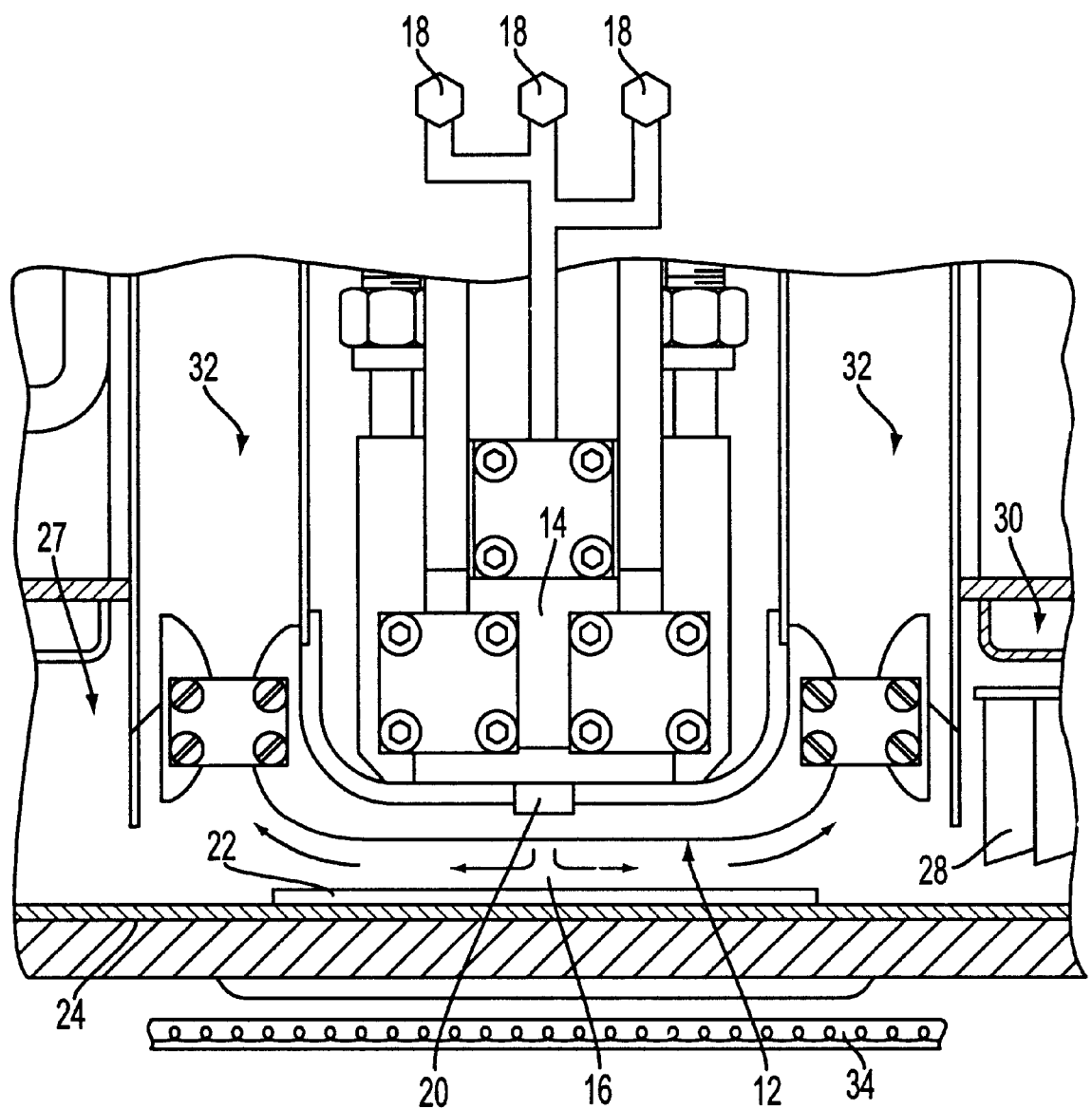
FIG. 2 is a schematic view of a processing module or chamber of the CVD system of FIG. 1, illustrating an existing prior art type of gas shield.

FIG. 1 schematically illustrates a section of an existing prior art CVD processing system 10 with which the protective shield assembly of this invention is used. As is known in the art, atmospheric pressure CVD systems typically include one or more processing modules or chambers 11 positioned along the process path. The components of the processing module 11 are shown in FIG. 2. Each processing module 11 includes an injector 14 for injecting chemical reagents and other gaseous substances into a reaction chamber or process area, generally designated 16, directly below the injector 14. In the illustrated example, the CVD system 10 includes four processing modules 11 as shown in FIG. 1, although it is to be understood that the number of processing modules 11 employed depends upon the constraints of a particular process. Conduits 18 deliver the gaseous substances to the injectors 14, which transport the gases through separate flow paths to one of the injection ports 20. Although not shown, each port 20 extends lengthwise along the longitudinal axis of the injector 14 to deliver the gaseous substance in a sheet-like flow to the reaction chamber 16. The substrate 22 is transported along the process path by a conveyor 24.

The entire process path is enclosed within a muffle 26 which provides a clean, contaminant free environment for the transport and processing of the substrate. As shown in FIG. 1, the processing modules 11 are separated by buffer modules 27 which isolate the processing modules 11 from the rest of the processing path. As shown in FIG. 2, the buffer modules 27 include a plurality of curtains 28 hanging from a plenum body 30 which is used to deliver an inert gas such as nitrogen between the curtains 28. Deposition waste products including unreacted gas are expelled from the reaction chambers 16 through exhaust vents 32 which are coupled to a suitable exhaust system (not shown). The chamber deposition area 16 and substrate 22 are retained at the desired reaction temperature by heating elements 34.

As the substrate is moved through each reaction chamber 11, the injected substances react with each other and/or with the upper surface of the substrate 22 to form a thin, uniform layer or film. The actual reagents used in the CVD process depend in part upon the type and quality of film desired. In one application of the processing system 10, the inner port 20 is coupled via injector 14 and one conduit 18 to a silicon source reactant such as TEOS, silane or disilane with nitrogen, and if desired a dopant source reactant such as TMPi, TMB, phosphine and/or diborane. The reagent is typically supplied with an inert carrier gas such as nitrogen. Oxygen or a combination of oxygen and ozone and nitrogen is delivered through another conduit 18 and the injector 14 to the outer ports 20. A stream of pure nitrogen travels through another conduit 18 to the intermediate separator ports 20 to separate the silicon, boron, and phosphorus source reactant from the oxidizing species until the gases approach the wafer surface.

One application of the shield 12 of this invention is described herein. Specifically, the shield 12 is shown protecting the front face of the injector 14 and the inlets of the exhaust vents 32. However, it is to be understood that the shield 12 may also be used in other applications such as protection of the chamber walls of process modules, or protection of the exhaust vent path including outlets. In addition, shield 12 can be applied to CVD systems operating at various pressures, not only at atmospheric pressure, such as for sub-atmospheric (SACVD) or low pressure (LPCVD) or high pressure systems. Shield 12 can also be applied to various film depositions of different composition, not only silicon oxide ($SiO_2$) or borophosphosilicate glass (BPSG) systems. The subject matter of this invention is not to be limited to any specific application.

Figure 3:
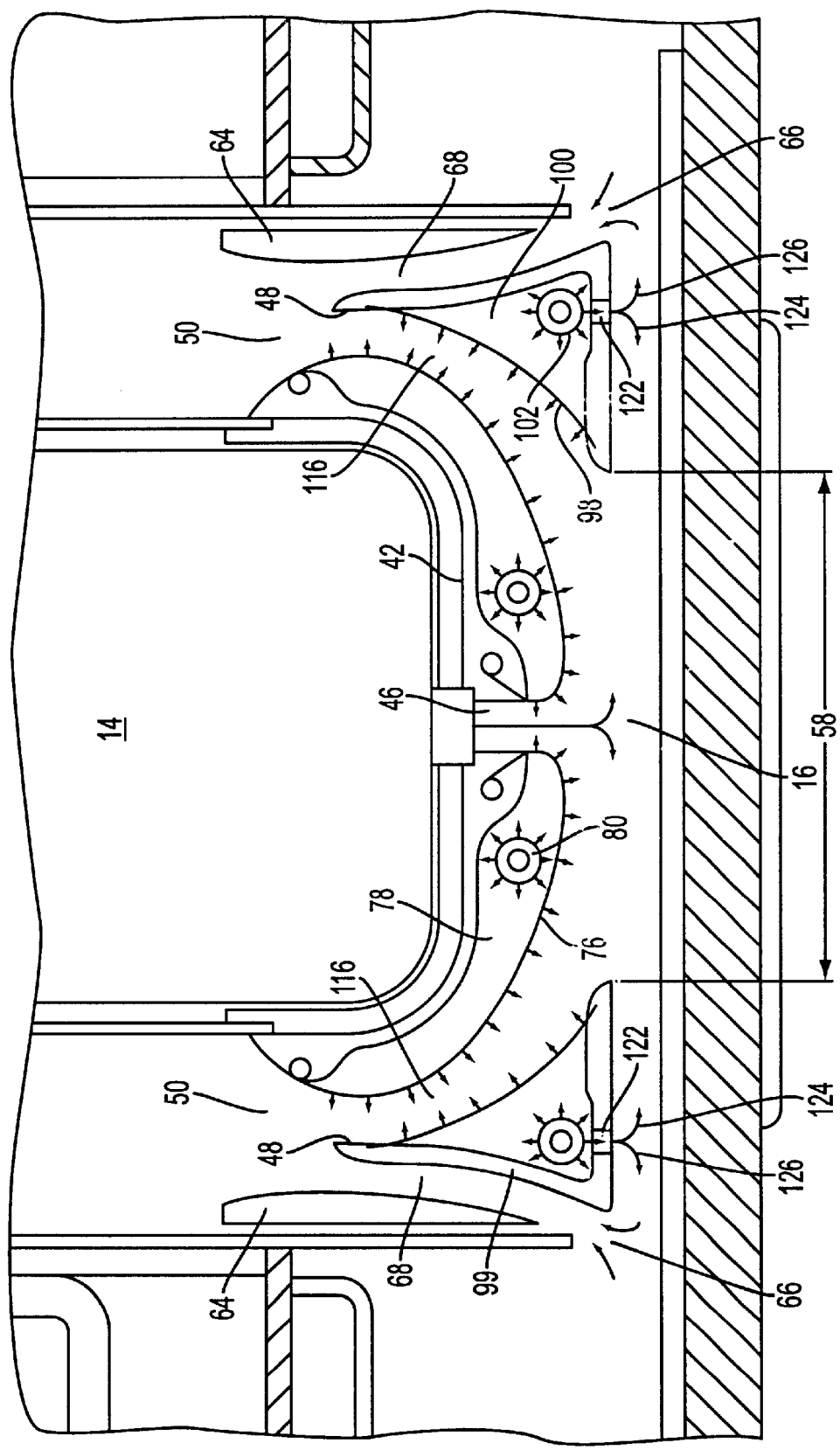
FIG. 3 is a schematic view, partially broken away, of a protective shield in accordance with the present invention, shown installed in a processing module.
Figure 4:
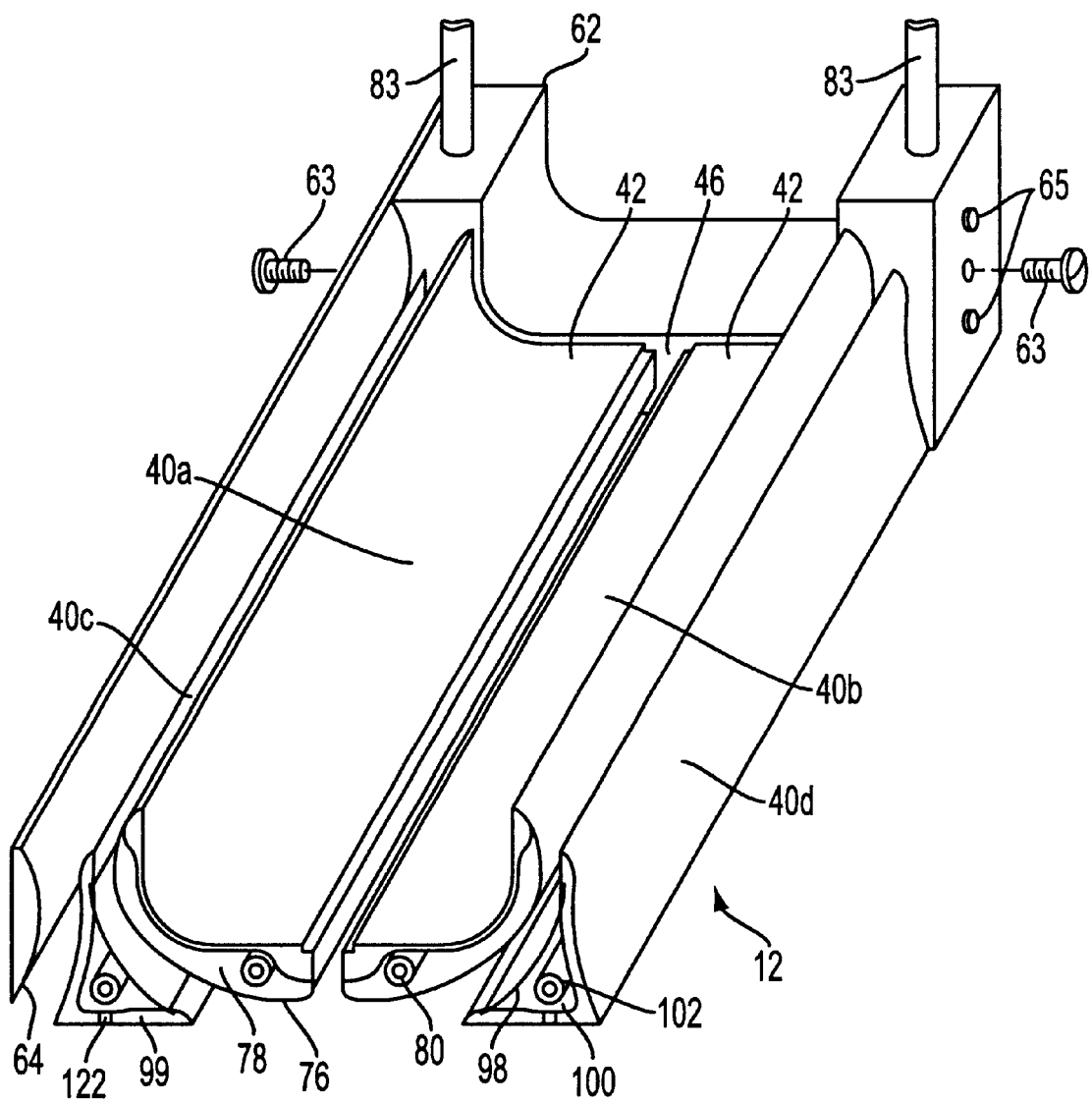
FIG. 4 is pictorial view of the shield assembly of FIG. 3.

Turning to FIGS. 3 and 4, the shield assembly 12 of this invention is positioned in front of the injector 14 and the inlets of the exhaust passageways 32 where it protects these surfaces against film deposition and the accumulation of potential contaminants. Unlike prior art shields, the shield assembly 12 of this invention also more precisely defines the boundaries of the reaction chamber deposition area 16. As discussed in more detail below, the shield 12 also prevents migration of the reagents outside the shunt sections of the shield 12, confining the reaction chamber deposition zone 16 to a precisely defined area. By controlling the size of the deposition area, the shield 12 of this invention provides greater control over the reaction chemistries and flow occurring within the chamber, thereby improving the quality and uniformity of the film deposited on the substrate.

The shield 12 has a modular construction and generally includes a number of separate shield bodies 40. Two of the shield bodies 40a and 40b cooperate to define the back wall 42 of the shield body 12 which is positioned against the front face of the injector 14 to wrap around the outer edges of the injector 14. This configuration ensures the front face of the injector 14 and the inlet edges 50 of the exhaust vents 32 will be substantially isolated from reaction by-products and unused reagents. The shield bodies 40a and 40b are spaced apart to define an inlet port 46 of the shield for the flow of the reagents injected by injector 14 through the shield. The size, shape and configuration of the inlet port 46 is dependent upon the configuration of the injection ports 20 of the specific injector 14 employed in the processing system 10. In this embodiment, the inlet port 46 has a narrow, elongate configuration and is sized so that the edge of the port 46 is positioned just outside of the outermost injection ports 20 to provide maximum protection for the front face of the injector 14. However, it is to be understood that the configuration of the inlet port 46 is subject to considerable variation within the scope of this invention. For example, in other modifications of the invention the shield bodies 40a and 40b may be combined into a single assembly and the inlet port 46 defined by an opening formed through the unitary assembly.

Shield bodies 40c and 40d are positioned below, and slightly outwardly of, the shield bodies 40a and 40b, with the inside edges 48 of the shield bodies 40c and 40d cooperating to define the beginning of the inner exhaust paths 116 leading to the exhaust vent inlets 50 of the exhaust vents 32 to remove process gases from the deposition zone 16. The shield bodies 40c and 40d are spaced apart, forming an outlet port 58 of the shield assembly 12 therebetween. The outlet port 58 is aligned with the inlet port 46, and is considerably larger than the inlet port 46. Since the shield 12 of this invention provides the boundaries of the reaction chamber deposition zone 16, the width of the outlet port 58 substantially defines the deposition area. In the illustrated embodiment, the outlet port 58 has a width of about 2.5 inches compared to the inlet port width of 0.25 inches. However, it is to be understood that the size and configuration of the outlet port 58 may be tailored to the constraints of a particular application.

The shield bodies 40 mate with end walls 62 to form the enclosed volume through which protective gas is introduced. The end walls 62 also have a U-shaped configuration to wrap around the front of the injector 14. Side walls 64 are mounted to the end walls 62 by bolts 63 or other suitable fasteners, thereby securing the various components of the shield 12 together. In the preferred embodiment, the shield bodies 40 are not mounted directly to the end walls 62 but allowed to expand and contract under varying temperature conditions as is described below in relation to FIGS. 7 and 8. The end walls 62 include outward projecting dowels 65 which facilitate assembly of the shield 12 by providing the correct alignment and spacing of said end walls when the side walls 64 are attached. Using bolts or other similar fasteners to secure the side walls 64 to the end walls 62, with the shield bodies 40 captured within this framework, allows the shield bodies to be easily assembled and taken apart, providing a modular shield body 12 which may be conveniently cleaned and maintained as is described in more detail below. However, in other forms of the invention, means which do not permit quick dismantling of the shield 12 may be used to secure the shield together.

The side walls 64 are spaced outwardly of the shield bodies 40a and 40b to define exhaust ports 50 for delivering exhaust directly to the exhaust vents 32. The upward-extending portion of the shield bodies 40c and 40d is spaced from the interior of the side walls 64, thereby dividing the gas flow path into exhaust ports 50 into two sections on each side, the purpose of which is described in more detail below. The side openings 66, which allow substrates to be transported through the process modules 11, also provide for the passage of gases from the buffer modules 27 outside the process modules 11 through the exhaust paths 68 formed between the inside edges of the side walls 64 and the exterior of the shield bodies 40c and 40d to the exhaust port 50. Instead of using the gap between the side walls 64 and the upward extending portions of the shield bodies 40c and 40d to form the side exhaust paths 68, it is to be understood that the side exhaust port may be provided by an opening in the side walls 64. In another embodiment of the invention, inert gas introduced through the shield bodies 40c and 40d may flow up the outer exhaust paths 68 and out into the buffer zones 27 through openings 66.

Figure 5:
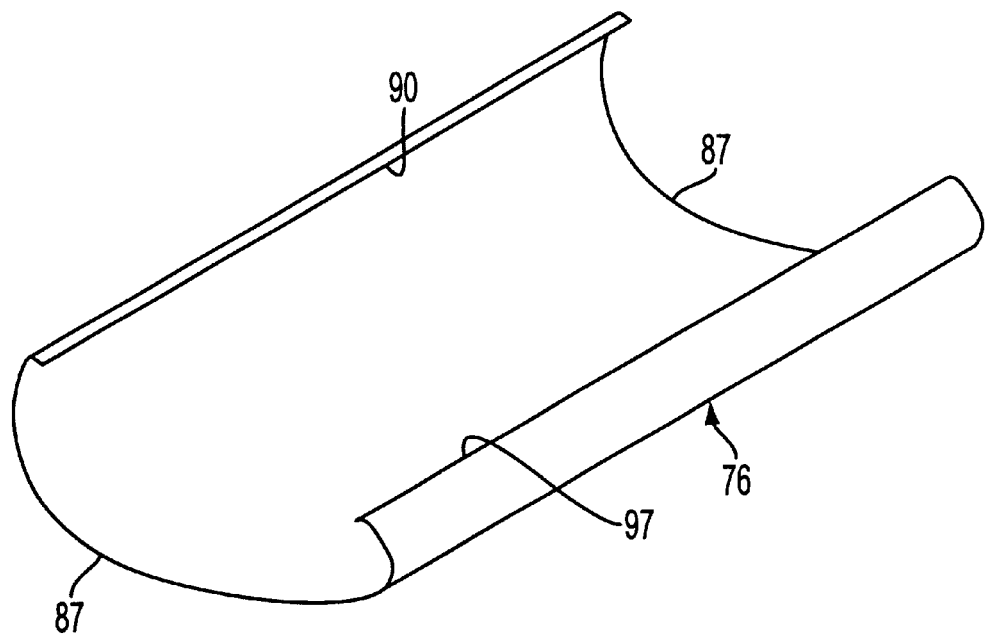
FIG. 5 is a pictorial view of the preformed perforated screen spanning the surface between the injector outlet port and inner exhaust vent of the shield assembly of FIG. 3.

The exposed surfaces of the shield bodies 40 are protected from the chemical reagents by barriers of inert gas such as nitrogen, argon, helium or other suitable gases. The nitrogen minimizes film deposition by blocking the surfaces of the shield bodies 40 from the chemical reagent stream. Since shield bodies 40a and 40b are substantially identical, although reversed relative to one another, only shield body 40a will be described in detail with the description applying equally to shield body 40b. The shield body 40a includes a perforated sheet or screen 76 which is bent or pre-formed to the desired shape, shown in FIG. 5, such that the sheet 76 stands away from the base 42 of the shield body 40a to form a plenum 78. The perforated sheet preferably has a thickness in the range of 0.005 to 0.012 inches, for example 0.008 inches. Suitable materials for the perforated sheet include stainless steel, inconel, or other similar alloys. The porosity of the screen is on the order of 10% –30%.

A gas supply device is used to fill the plenum 78 with an inert gas such as nitrogen at a flow rate such that the nitrogen permeates the perforated sheet 76 and forms a nitrogen cloud in front of the sheet 76. In the illustrated embodiment, one or more conduits or metering tubes 80 are positioned in the plenum 78 and coupled through the end walls 62 to an exterior source of inert gas (not shown) for delivering the gas to the plenum. The wall of the metering tube 80 is porous, allowing the gas to diffuse uniformly through the tube wall in all directions. Thus, extraction of the gas from the metering tube is not limited to discrete holes formed in the conduit wall as in prior art systems. With such prior art systems, the discrete holes drilled in the solid tube cause the gas to exit each hole at a high velocity, maintaining a high degree of momentum from the thin metal surface and creating localized jets of gas within the plenum. These localized jets result in a non-uniform distribution of inert gas in the plenum and along the front of the screen, adversely affecting the protection afforded against more rapid deposition on the screen and the uniformity of the reagents within the chamber and the uniformity of the deposited film. With the metering tube 80 of the present invention, the gas diffusion occurs evenly along the entire length and circumference of the tube, filling the entire plenum with the gas at a uniform rate. Thus, the conduit 80 provides a low-velocity, uniform supply of gas free of localized effects. Materials for conduit 80 which exhibit the desired porosity include nickel, stainless steel, or silicon carbide. While the metering tubes 80 are preferred, it is to be understood that the conduits 80 may be replaced with the prior art conduits having a solid wall formed with a series of holes for injecting the inert gas into the plenum.

To achieve a uniform distribution of gas within the plenum, the metering tube 80 or a number of conduits in combination preferably extend substantially along the length of the plenum 78. As shown particularly in FIG. 3, the metering tube 80 is located in the vicinity of the inlet port 46 to provide a substantial nitrogen concentration in the deposition zone. The nitrogen or other inert gas is supplied to metering tube 80 at a flow rate which ensures the plenum will be continuously filled with sufficient gas to provide a satisfactory gas barrier across the entire surface of the perforated sheet 76. Typical flow rates of nitrogen gas used in shield bodies 40*a* and 40*b* for the APCVD process modules described herein are approximately 5 to 15 standard liters per minute.

Figure 6:
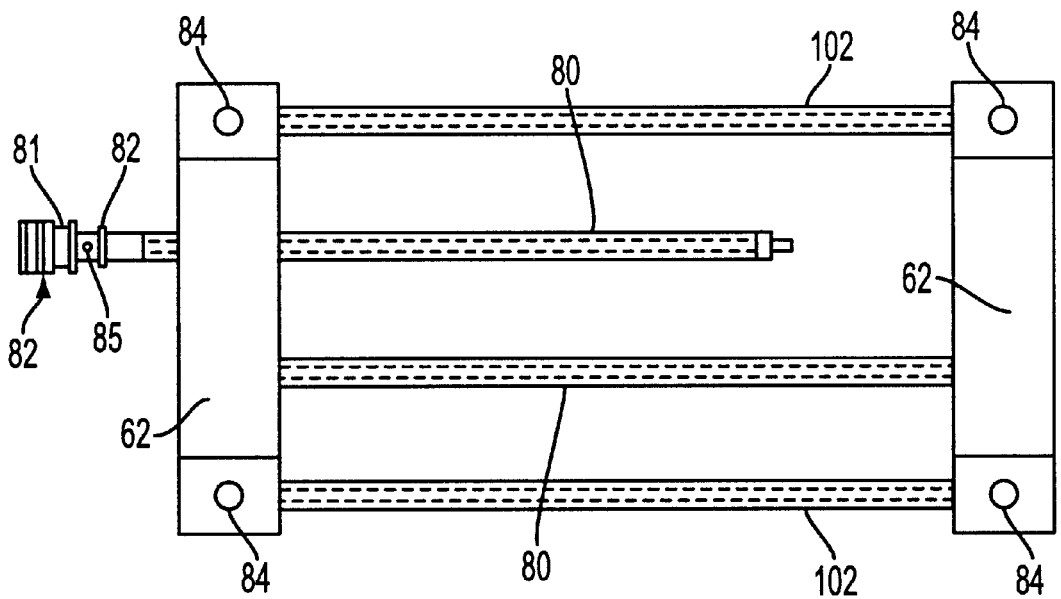
FIG. 6 is a top plan view of the end walls and internal metering tubes of the shield assembly of FIG. 3.

In the preferred embodiment, the shield 12 has a modular design to be easily and conveniently cleaned and maintained. As shown in FIG. 6, the metering tube 80 is inserted through an opening formed in the end wall 62 and secured in place via a mounting member 81 provided at the end of the conduit. C-ring seals 82 or other suitable sealing means provide a seal between the metering tube 80 and the end wall 62. Gas is delivered to the end wall 62 via gas supply tubes 83 (FIG. 4) and fittings 84. The gas flows through internal passages formed in the end wall (not shown) and enters the metering tube 80 via an opening 85 in the tube. In this embodiment, the metering tube 80 of each shield body 40*a* and 40*b* is inserted through a different one of the end walls 62. However, in other modifications of the invention, the metering tubes 80 for both shield bodies 40*a* and 40*b* may be inserted through the same end wall. Inserting the metering tubes through the end walls allows the metering tubes 80 to be easily removed without detaching one or both of the end walls 62 or removing the screens 76. While the ability to remove the conduit 80 through the end plate 62 is advantageous, it is to be understood that other embodiments of the invention may include conduits which are entirely contained within the plenum 78 or attached to the inside of an end wall, requiring removal of an end plate 62 to remove the conduit.

CVD processing typically occurs at elevated temperatures, often as hot as 600° C. With prior art shields, the screen is exposed to the hot chamber while the shield backplate is situated behind a plenum filled with a continuous stream of nitrogen. Thus, the back plate is at a lower temperature than the screen. The smaller thickness, lower mass, and higher temperature of the screen causes the screen to expand faster and to a greater extent relative to the backplate. Since the screen is welded directly to the backplate, this thermal expansion causes the screen to warp, bend or buckle. Repeated heating of the shield may cause the screen to crack. Prior art shields have used embossed indentations formed in the screen or other means to reduce this buckling effect. However, these measures have not completely overcome the buckling problem. Moreover, the deformation of the screen and the embossed indentations distort the geometry of the reaction chamber, interfering with the uniform distribution of reagents within the chamber deposition zone 16. With the shield 12 of this invention, buckling of the perforated screen is substantially eliminated as it is free floating rather than constrained at its edges.

Figure 9:
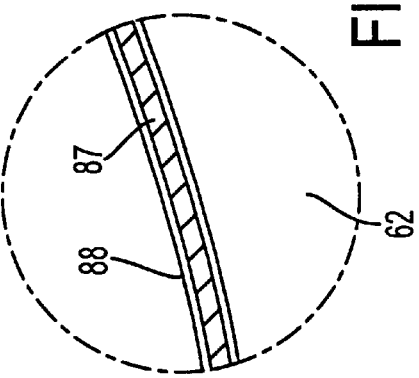
FIG. 9 is an enlarged view taken substantially of area within circle 9—9 of FIG. 7.
Figure 7:
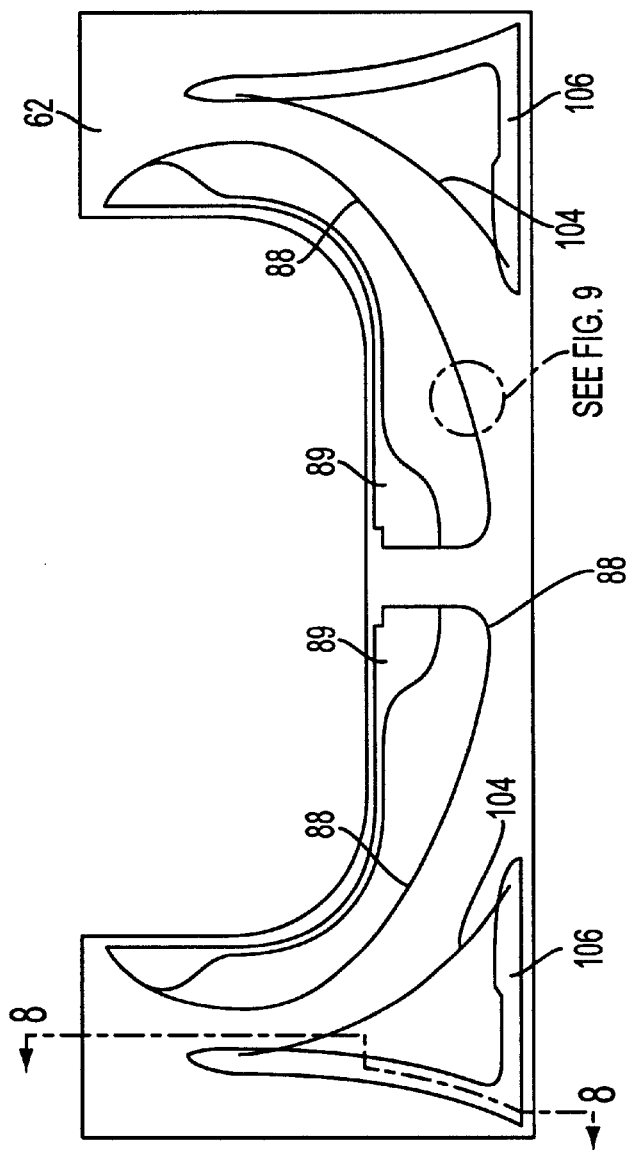
FIG. 7 is a front plan view of an end wall of the shield assembly of FIG. 3.

In the preferred embodiment of the invention, the shield body 40*a* is not affixed or welded to the end walls 62, and the perforated sheet 76 is not affixed or welded to the shield base 42 or end walls 62. Instead, the shield body 40*a* and the perforated sheet 76 are held in place in a manner which permits movement of the shield body 40*a* and sheet 76 relative to the framework of the end and side walls 62 and 64 as the shield body 40*a* and sheet 76 expand and contract under varying temperature conditions without creating internal compressive stresses which could lead to buckling, warping and the like. The interior of at least one and preferably both of the end walls 62 are shaped to hold the ends of the perforated sheet 76 and the base 42 of the shield body. As shown in FIGS. 7 and 9, the end wall 62 includes a channel 88 formed in the end wall 62 which corresponds to the shape of the pre-bent perforated sheet 76. The ends 87 of the perforated sheet are seated in a channel 88, with the walls of the channel 88 holding the sheet ends in place. The end wall 62 also includes a recessed area 89 which conforms to the shape of the base 42 of the shield body 40*a*. The shield body 40*a* is seated in this recessed area to couple the shield body 40*a* to the end walls 62. The walls of the channel 88 and the recessed area 89 also substantially seal the ends of the sheet, preventing the flow of gas around the end of the perforated sheet.

The channel 88 and recessed area 89 have a depth such that, at temperatures near room temperature, there is a significant gap between the ends of the sheet 76 and base 42 of the shield body 40*a* to the closed end of the channel 88 and recessed area 89. At the elevated operating temperatures, which are typically greater than 400°, the perforated sheet 76 and base 42 can expand, causing the ends of the sheet 76 to substantially fill the channel 88. The channels 88 and recessed areas 89, which are formed in both end walls 62, accommodate expansion of the perforated sheet, minimizing or even eliminating buckling or warping of the perforated sheet. In the present embodiment, in which the perforated sheet 76 is formed of stainless steel and has a thickness of about 0.008 inch and an insertion length of about 0.150 inch into the channel 88, the channel 88 has a depth in the range of 0.200 inch and a breadth in the range of 0.0085 to 0.010 inch. The recessed area 89 also has a depth in the range of 0.200 inch to accommodate a similar insertion depth of 0.150 inch of the base 42, and the tolerance in the range of 0.001 to 0.005 inch in breadth greater than the shape of the base 42.

Figure 10:
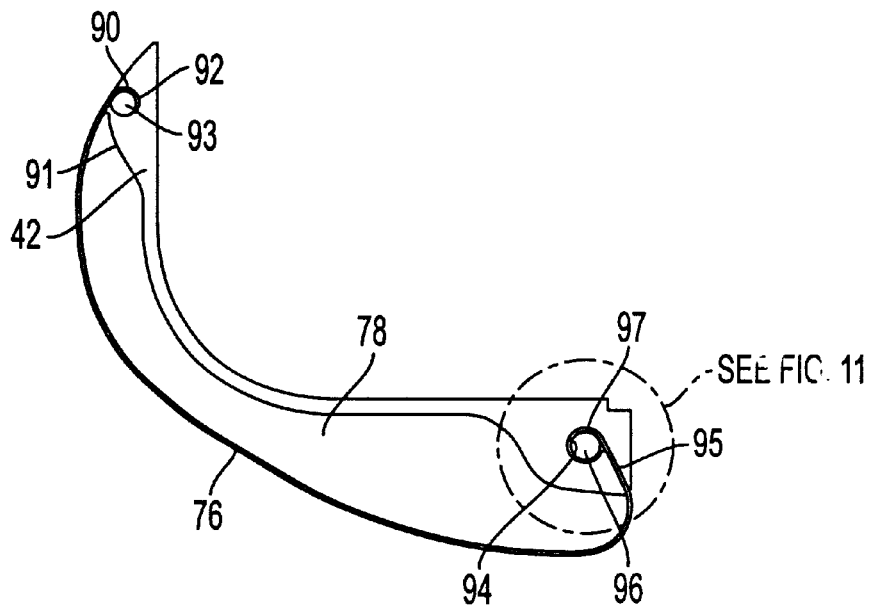
FIG. 10 is an end view of an injector section gas delivery assembly of the shield assembly of FIG. 3.
Figure 11:
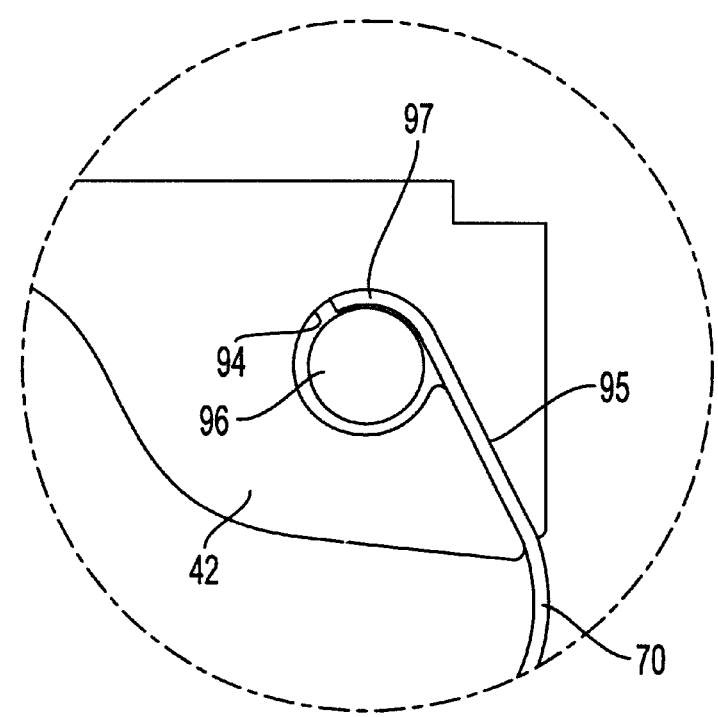
FIG. 11 is an enlarged view taken substantially of area within circle 11—11 in FIG. 10.

The side edges 90 and 97 of the perforated sheet 76 are held by the shield body 40*a* in a manner which permits movement of the sheet 76 relative to the base 42 of the shield body. As shown in FIGS. 10, the base 42 of the shield body 40*a* includes a curved support surface 91 having a longitudinally extending bore 92 formed therein. The side edge 90 of the perforated screen 76 is slipped into the bore 92 and the locking pin 93 slipped into the space between side screen edge 90 and the wall of the groove 92. While the pin 93 holds the edge 90 of the screen 76 in the groove, the pin is not affixed to either the sheet 76 or the base 42. As the screen 76 expands under elevated temperature conditions, the side edge of the screen 90 is allowed to travel in a clockwise direction around the pin 93 such that the sheet 76 may expand without creating the internal forces which will eventually damage or distort the sheet. As shown in FIGS. 10 and 11, the base 42 of the shield body 40a also includes a longitudinally extending bore 94 formed through the base 42. a slit 95 extends outwardly from the bore 94. The side edge 97 of the perforated sheet 76 is inserted through the slit 95 and into the bore 94. a locking pin 96 inserted into the bore 94 secures the sheet edge in place, while permitting the sheet edge to expand around the locking pin 96 as described above.

The shield bodies 40c and 40d are similar to the shield bodies 40a and 40b. Only shield body 40c is described in detail since the shield bodies 40c and 40d are identical, although reversed relative to one another. This description applies equally to the shield body 40d. The shield body 40c includes a perforated sheet or screen 98 which is spaced from the base 99 of the shield body 40c, forming a plenum 100 between the perforated sheet 98 and the base 99. a gas supply device, such as one or more metering tubes 102, fills the plenum with an inert gas such as nitrogen. The metering tube 102 is substantially identical to the metering tube 80, described above. In this embodiment, the metering tube 102 of each shield body 40c and 40d extends through a different one of the end walls 62. However, if desired the metering tubes 102 of both bodies 40c and 40d may be mounted to the same end wall 62. The metering tube 102 fills the plenum 100 with the gas, and the gas passes through the sheet 98 and forms a gaseous cloud in front of the screen 98 to inhibit film deposition on the screen.

Figure 8:
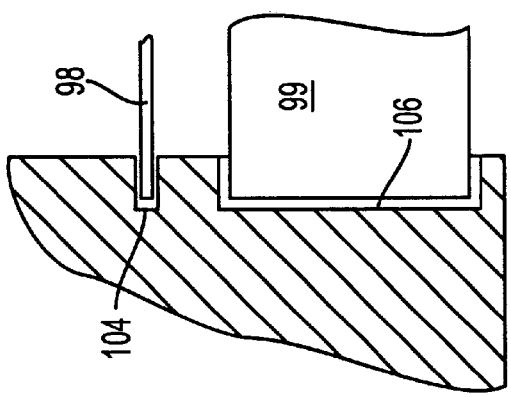
FIG. 8 is a cross-sectional view taken substantially along line 8—8 of FIG. 7.

As with shield body 40a, the shield body 40c is captured by the end walls 62 and the perforated sheet 98 is captured by the shield base 99 and end walls 62 such that the base 99 and perforated sheet 98 are movable relative to the end walls 62 and each other during expansion and contraction of the sheet under varying temperature conditions. The end walls 62 include a channel 104 into which the ends of the perforated sheet 98 are seated (FIGS. 7–8). The end wall 62 is also formed with a recessed area 106 shaped to receive the ends of the base 99 of the shield body 40c. The walls of the channel 104 and recessed area 106 hold the shield body 40c in place and prevent the leakage of gas from the ends of the plenum 100. a gap exists between the edges of the perforated sheet 98 and base 99 to the bottom of the channel 104 and recessed area 106 to permit expansion of the perforated sheet 98 and the base 99 under varying temperature conditions. As discussed above in relative to the shield body 40a, the perforated sheet 98 and base 99 can expand as temperatures increase causing the ends of the sheet to move deeper into the channels 104 and the ends of the base 99 to move deeper into the recessed area 106. Thus, the channel 104 and recessed area 106 of the end walls 62 hold the shield body 40c in place while permitting expansion and contraction of the shield body 40c and screen 98 under varying temperature conditions.

The side edges of the perforated sheet 98 are also retained by the base 99 of the shield body 40c in a manner which permits movement of the screen 98 relative to the base 99 as the screen expands and contracts. As shown particularly in FIGS. 12 and 13, the base 99 includes a first retainer 108 and a second retainer 110 for holding the side edges of the perforated sheet 98. In this embodiment, the retaining members 108 and 110 are provided by longitudinally extending slots formed in the base 99. The side edges of the perforated screen 98 are seated in the slots 108 and 110, which hold the edges in place while permitting expansion and contraction of the screen 98 under varying temperature conditions. In this embodiment, the slots 108, 110 each have a depth of about 0.10 inch and a width of about 0.010 inch.

With the channels and recessed areas formed in the end walls 62 and the configuration of the base 42 of the shield bodies 40a, 40b and the base 99 of the shield bodies 40c, 40d, the perforated sheets 76 and 98 may be easily slipped into said bases and said shield bodies inserted into said end walls. The shield assembly 12 is easily completed by attaching the side plates 64 to the end wall 62 with as few as four bolts 63, and inserting the four metering tubes 80 and 102, each with a single fitting 81. Even with the nitrogen barriers, some film may be deposited on the surfaces of the perforated sheets 76 and 98 after processing for extended periods of time. When the accumulated film begins to interfere with the operation of the shield 12, the shield 12 may be easily dismantled to remove the shield bodies 40 for cleaning or replacement of the coated screens. New or clean screens 76 and 98 or shield bodies 40 may be installed for continuous operation while the used screens or bodies 40 are cleaned, reducing the time during which the processing system 10 is idle or shut down. The shield bodies 40 and screens 76 and 98 may be reused at a later time after they have been cleaned. The porous metering tubes 80 and 102 may also be easily removed from a whole shield body 12, in case cleaning of the remaining parts as a unit is desired.

Figure 14:
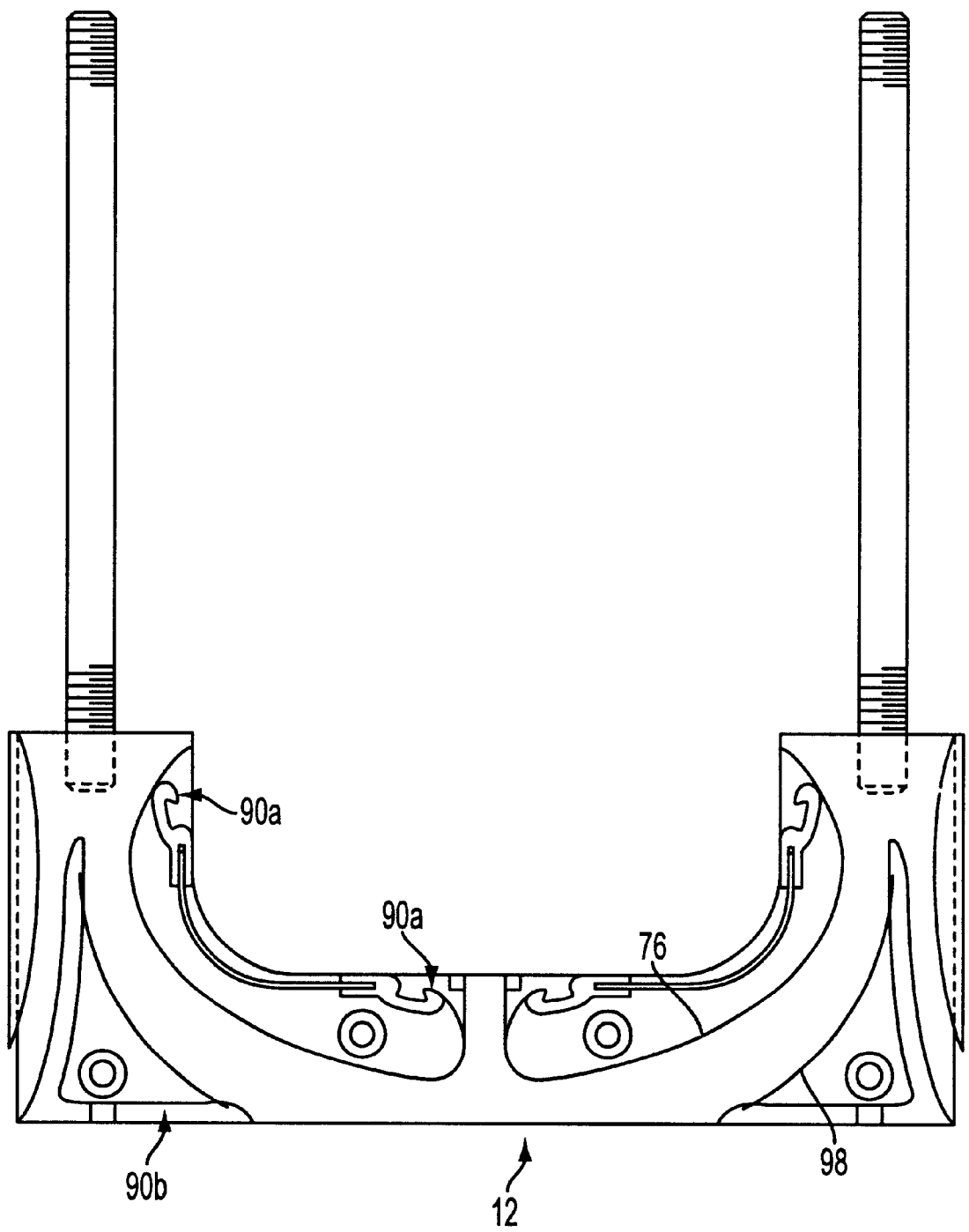
FIG. 14 is a cross-sectional view of a shield assembly in accordance with another embodiment of the invention.

FIG. 14 shows an embodiment of a shield body 12 which includes a different type of retainer 90a for holding the perforated screen in place. The principle of operation is the same as the technique already described to attach screen 76 to base 42 (FIG. 10) in that two parts interlock, creating the geometry which acts to capture the screen without constraining the edge of the screen. The shape of retainer 90a is just different than the simple rods 93 and 96 used for shield body 40a.

Additionally, different shapes of the slots and screen edges than described to attach screen 98 to base 99 (FIG. 12) can be employed as well, as shown in FIG. 14 by slot 90b.

As is shown in FIG. 3, the passageways 116 provided between the shield bodies 40a and 40b and the shield bodies 40c and 40d deliver unused reagents and reaction by-products directly to the exhaust ports 50, ensuring the efficient removal of the process exhaust from the deposition zone 16. This is different from prior art shields, which do not direct the gases to the exhaust vents within a controlled path, but merely provide a layer of inert gas in front of the exposed surfaces of the injector and exhaust vent inlets. Nitrogen emitted through and covering the perforated sheets 76, 98 isolates the perforated sheets from the chemical reagent stream and inhibits deposition of film on the surface of the perforated sheets. a uniform supply of the inert gas is provided in front of each perforated screen since buckling, warping or other deformation of the screen is avoided by allowing the screens to move relative to the shield body and end plates under varying temperature conditions. Thus, the more uniform layers of inert gas improves the quality of the deposited film by reducing the accumulation of contaminants within the chamber and promoting uniform distribution of the reagents within the chamber.

Figure 12:
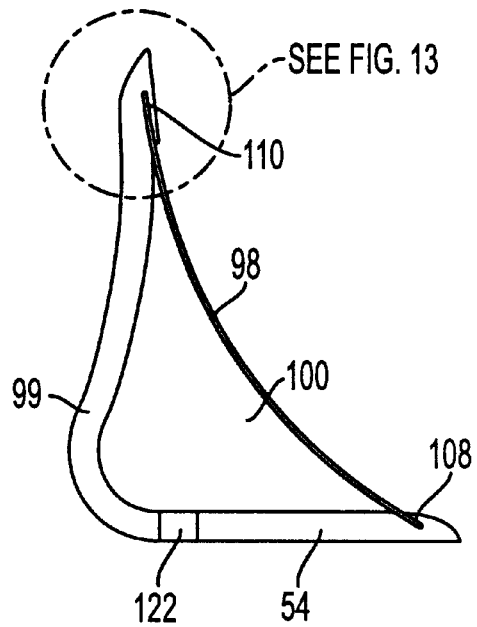
FIG. 12 is an end view of the shunt section gas delivery assembly of the shield assembly of FIG. 3.
Figure 13:
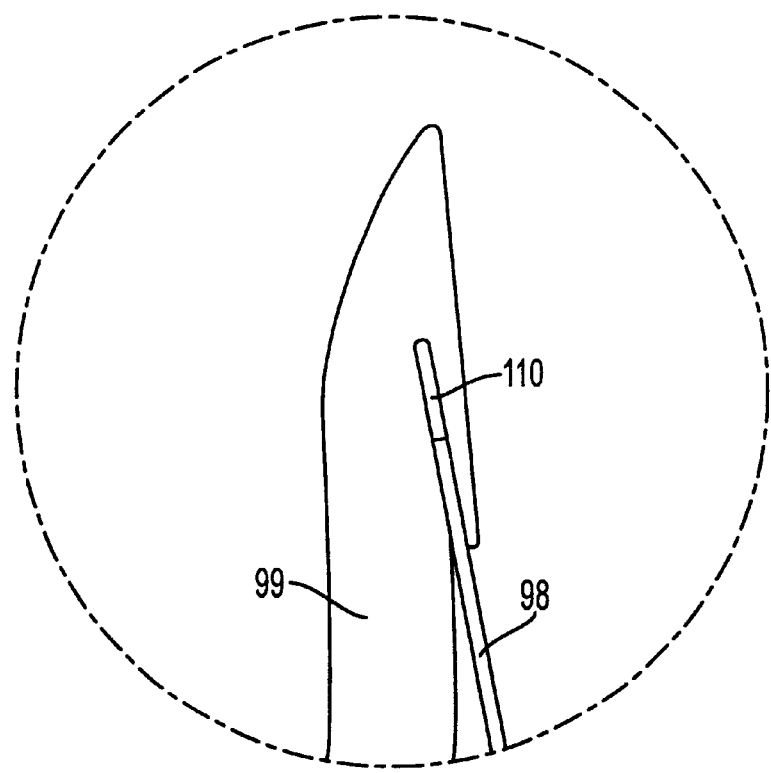
FIG. 13 is an enlarged view taken substantially of area within circle 13—13 in FIG. 12.

With the shield 12 of this invention, the deposition area 16 is confined to the area 58 of the substrate directly below the outlet port. As shown in FIGS. 3 and 12, the shield bodies 40c and 40d each create dual exhaust paths to the exhaust vent inlet 50 and also include a bottom outlet port 122 formed in the base 99 of the assembly. The bottom outlet port 122 causes a stream of inert gas to flow from the plenum 100 through the base 99 to the area below the shield adjacent to the outlet port 58. The substrate 22 or the conveyor 24 causes separation of the flow from the bottom outlet port 122 into a shunt containment flow, designated at 124, and a shunt outflow, designated at 126. The shunt containment flow 124 provides a buffer of inert gas below the shield bodies 40c and 40d, preventing the reagents or reaction by-products from leaving the deposition zone 16 by escaping beneath the shield 12. The containment shunt flow 124 isolates the reaction chamber, allowing the width of the deposition zone to be precisely controlled and improving process performance.

The shunt outflow 126 flows around the shield bodies 40c, 40d and through the outer shunt exhaust path 68 to the exhaust port 50. Directing this stream of inert gas to the exhaust port 50 ensures the process exhaust via path 116 from the deposition area 16 will be carried directly to the exhaust vent 32 for extraction from the system 10 and also dilutes the chemical concentration and increases velocity to ease the removal of by-products. The shunt outflow 126 also provides a barrier between the buffer modules 27 and the reaction chamber deposition area 16, effectively isolating the reaction chamber from the conditions in the areas upstream and downstream of the process modules 11.

The shield 12 of this invention creates a buffer gas zone on opposite sides of the reaction chamber. The inert gas is delivered to the plenum 100 at a flow rate sufficiently high to maintain a constant flow stream for both the shunt containment flow 124 and the shunt outflow 126 as well as the protective flow through the screen 98, ensuring the desired buffer zone is created on either side of the deposition zone.

With the shunt containment flow 124 and shunt outflow 126, the deposition zone boundary and the process gas flows can be precisely and uniformly controlled as all the gases are supplied and metered within the chamber, producing a higher quality film.

With prior art systems, an example of which is shown in FIGS. 1 and 2, the exhaust flow rate to vents 32 is greater than the rate at which gases are supplied within the chamber area of process modules 11 so that the inert gas supplied by plenums 30 or from the buffer modules 27 may be drawn into the reaction chamber to form a barrier preventing the escape of reagents into the curtain area. a problem with this system is that the buffer gas is typically provided and drawn into the chamber area through side openings 66 in a non-uniform distribution, resulting in a non-uniform distribution of reagents along the edges of the chamber which detracts from the uniformity of the film deposited on the substrate 22. The inflow of gas from the curtain area 27 and the flow of process exhaust from the injector 14 within the chamber to the exhaust vent 32 create a large stagnant pocket between the two flow streams where reagents and reaction by-products are recirculated. The recirculating gases interfere with the ability to precisely control the reaction chemistry within the complete deposition zone 16. These problems with the prior art processing systems are overcome by the shield of this invention.

With prior art shields, the recirculating flow is produced in the relatively large area between the exhaust inlet to vent 32 and the upper surface of the conveyor 24 or substrate 22.

With the shield of this invention, the shunt containment flow 124 and the streamlined shape of the shield bodies 40c and 40d effectively minimizes the amount of recirculation of the reagents where the gas streams meet, ensuring the reagents are efficiently exhausted through exhaust vents 32. In the embodiment shown in FIG. 3, the shunt section shield bodies 40c and 40d are located to substantially physically block the large recirculation volume present in the prior art shield represented in FIG. 2.

With the shield 12 of this invention, the inert gas supplied by the shield bodies 40 ensures that the reagents and reaction-by-products will be safely retained within the deposition area 16. With the new shield 12 this containment can be accomplished where gas is introduced into the chamber either at a lower or greater rate than the flow rate of the exhaust through vents 32. So inert gas can either be flowing into or out of the process module 11 through openings 66, whereas the prior art has to draw gas from buffer module 27 in through openings 66 to provide containment. The gas which is not accommodated by the exhaust vents 32 flows into the buffer modules 27 between the process modules 11 and is removed from the muffle via by-pass ducts 130 connecting the buffer modules 27 to a separately controlled exhaust vent, as shown in a new muffle design in FIG. 15. Since the reagents are safely contained within the reaction chamber and delivered directly to the exhaust ports 50 and vents 32, the gas which is vented through the by-pass valves is nitrogen. No reagent or by-products are carried to the by-pass vents 130. Utilizing the by-pass ducts 130 to extract excess inert gas from the process modules allows all the gas flow within the process chambers to be supplied and controlled by the geometry within the chambers, more effectively isolating the process results of deposition on wafers inside the chambers from any external disturbances or non-uniformity present as in an open APCVD system.

As is apparent from the forgoing, the present invention provides a shield 12 which may be used to achieve improved uniformity of reagents within the reaction chamber, greater control over the reaction chemistry residence time, and precise control over the geometry of the reaction chamber 16 and deposition zone, thereby enhancing the quality of the deposited film. The shield 12 can withstand changing temperature conditions without damaging or deforming parts of the shield which could reduce the effectiveness of the shield operation. The shield 12 is modular, and may be conveniently and quickly assembled and dismantled for maintenance or cleaning. The shield 12 includes metering tubes 80, 102 which deliver the inert gas to the plenum in a more uniform distribution, improving the uniformity of the reagents within the deposition zone 16. The shield is used to form a barrier or buffer zone on opposite sides of the reaction chamber, preventing reagents from escaping from the chamber and allowing a uniform distribution of buffer gas to be provided within the muffle 26. It is to be understood that this invention is not limited to the shield 12 of the illustrated embodiment which includes each of the features described herein. Instead, it is to be understood that shields incorporating only some of the features described herein is within the scope of this invention.

New Embodiment

An alternative embodiment of the shield 112 present invention is illustrated in FIGS. 16 through 23. As shown with reference to FIG. 16, shield bodies 140a–140d have a construction called a "frame construction" which is different from the above described embodiment. Each of the shield bodies 140a–140d include a base that is formed of a single piece of material and has a continuous unit frame around the periphery of the base. The shield body further includes at least one perforated sheet carried in the unit frame, a plenum between the base and the perforated sheet, and a gas delivery device for delivering an inert gas to the plenum at a flow rate such that the gas diffuses through the perforated sheet. The shield body is referred to as a "unit" shield body since the base and the unit frame that carries the sheet are formed from one piece. Thus, the sealing of the sheet is performed by one piece. In the earlier described embodiment, three pieces were used to seal the sheet, i.e. the base with an attache mechanism such as the locking pin, and the two end walls. In the earlier described embodiment, the sheet is carried by the base, however in this embodiment the base 139 includes a continuous unit frame 141 having ends 142 and 143, and the perforated sheet is carried by the unit frame 141. The perforated sheet is captured by the continuous unit frame 141 of the shield body, and the shield body is captured by an end wall. Thus, the sheets can freely expand and contract relative to the shield body and the shield body can freely expand and contract relative to the end wall and frame assembly of the shield 112. The shield assembly and its components are made of a metal alloy, such as stainless steel and commercially available alloys such as Haynes 214, Inconel and Kovar, and the like. Further, the shield assembly and at least one of its components may be treated by an oxidation process as described in pending U.S. patent application Ser. No. 08/823,655 the description of which is incorporated by reference herein in its entirety. The oxidation treatment provides components that are less susceptible to corrosion and minimizes contamination. Preferably, the shield assembly is made of a combination of stainless steel parts and oxidized Haynes 214 parts. It is preferred to use oxidized Haynes 214 material for parts that are within the wafer path and are exposed to temperatures exceeding about 350° C., such as shunt shield bodies 140c and 140d.

Figure 17A:
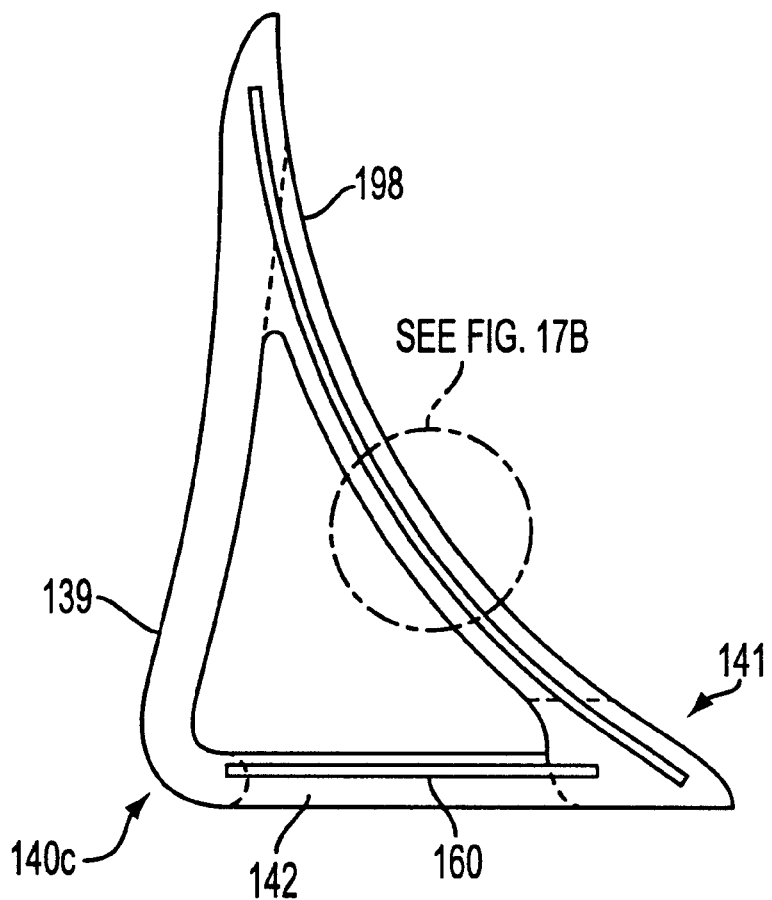
FIGS. 17a and 17b are an end view, and an enlarged view taken substantially of the area within circle 17b—17b, respectively of one shield body of the shield assembly of FIG. 16.

The shield body of this embodiment is shown in more detail with reference to FIGS. 17 to 19. One shield body 140c is illustrated in FIG. 17a, a cross-sectional view. Shield body 140c is similar to earlier described shield body 40c in shape and function. Thus, as with shield bodies 40c and 40d, shield bodies 140c and 140d are positioned below and slightly outwardly of shield bodies 140a and 140b. The inside edges of the shield bodies 140c and 140d cooperate to define the beginning of the inner exhaust paths 116 leading to the exhaust vent inlets 50 of the exhaust vents 32. The shield bodies 140c and 140d are spaced apart and form therebetween the outlet port 58 of the shield assembly. Since shield bodies 140c and 140d are substantially identical, although reversed relative to one another, only one shield body 140c is described in detail below.

Shield body 140c includes a perforated sheet or screen 198 which is bent or preformed to a desired shape. The sheet stands away from the base 139 of the shield body 140c to form the plenum 100, which receives the gas supply device such as the metering tubes earlier described. The sheet 198 preferably has a thickness in the range of about 0.005 to 0.012 inches, with a typical value being 0.008 inches. As shown, the shield body 140c is no longer formed of only a base, but is formed of a base 139 which includes a continuous unit frame 141c. In this embodiment, the unit frame 141c includes spaced apart end sections 142 and 143, and top and bottom sections 144 and 146 which extend longitudinally between the end sections. That is, the base 139 includes a continuous unit frame 141c and end sections 142 and 143 at each end of the base 139, and these end section define a perimeter of the shield body 140c at its ends. The sheet is not rigidly attached but is held such that the sheet moves relative to the shield body. The sheet 198 is retained by longitudinally extending slots or slits 145 formed in the unit frame 141c and its end sections 142 and 143. The perforated sheet 198 is inserted into the slot 145, through one end section, and the side and end edges of the sheet are seated in the slot which holds the edges of the sheet in place while permitting expansion and contraction of the sheet. Thus, the sheet is held along its entire length and ends in the frame, and not only along its ends as in the earlier described embodiment. While the earlier described embodiment is a significant improvement to the prior art, this new embodiment is the preferred embodiment. The frame construction allows for easier insertion of the sheets, and provides a stronger shield body, seals the screen within a single unit frame part thereby reducing the total number of parts and complexity of the assembly. In other words, the screen is now sealed by a single part, the continuous unit frame, instead of by multiple parts as in the earlier described embodiment.

Figure 17B:
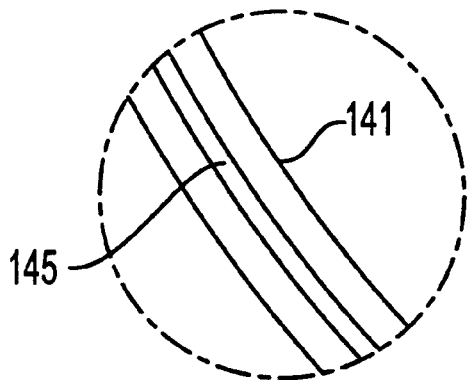

The slot 145 is shown in more detail with reference to FIGS. 17a and 17b. The slot 145 substantially conforms to the shape of the sheet 198. The screen is sized such that, at temperatures near room temperature, there is a gap between the perimeter of the sheet 198 and the boundaries of the slot within the unit frame. At the elevated operating temperatures, which are typically greater than 400° C., the perforated sheet 198 can expand causing its edges and ends to substantially fill the slot 145.

Figure 18A:
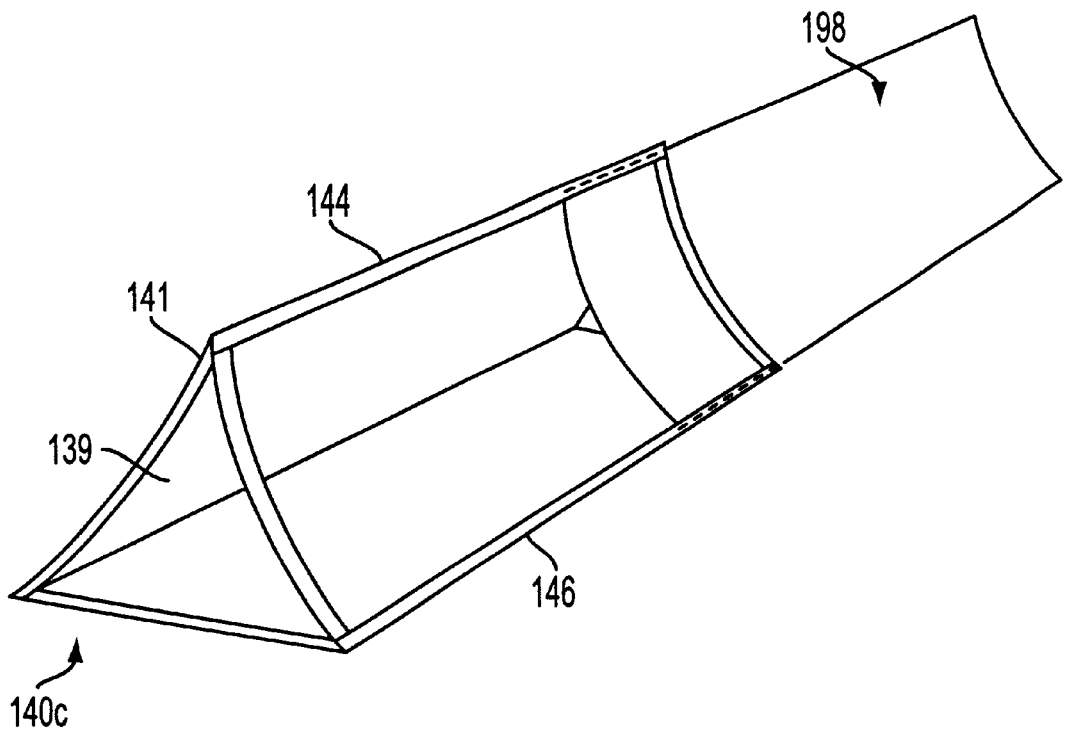
FIGS. 18a and 18b are pictorial views of one shield body of the shield assembly of FIG. 16, and shows the sheet being inserted into the shield body.
Figure 18B:
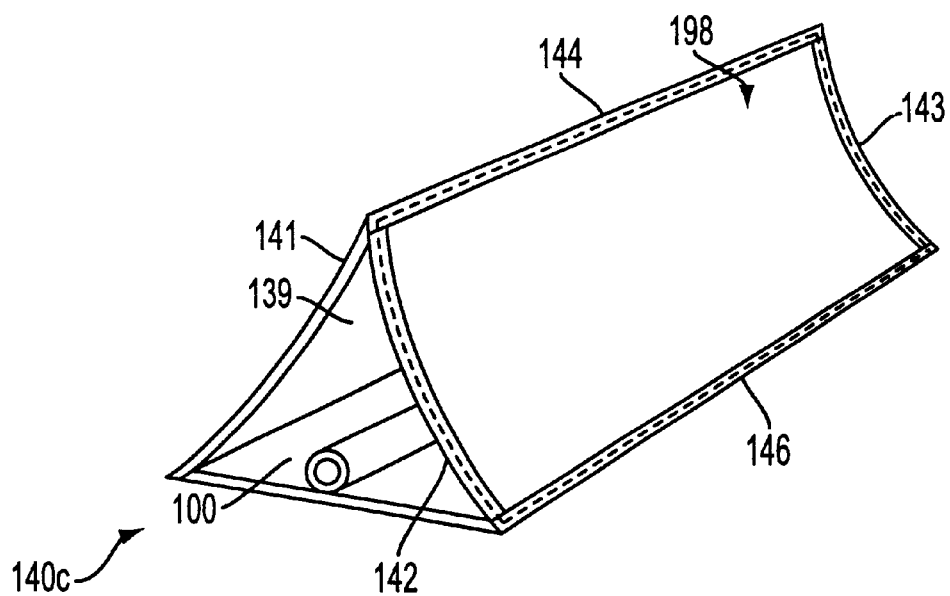

The perforated sheet is inserted as shown in FIGS. 18a and 18b. Of particular advantage, the sheet is easily inserted in one end of the frame end 142 or 143. The sheet then slides along the slots in the top and bottom 144 and 146 portions of the unit frame as shown in FIG. 18a, and into the slot in the opposite end section of the unit frame. FIG. 18b shows the sheet in its fully inserted position. Thus, the sheet is secured along its entire perimeter, and yet it is not fixedly secured and may freely expand and contract, thereby minimizing the tendency to buckle. Further, the sheets are readily removed and reinserted for easy maintenance and replacement.

Figure 19A:
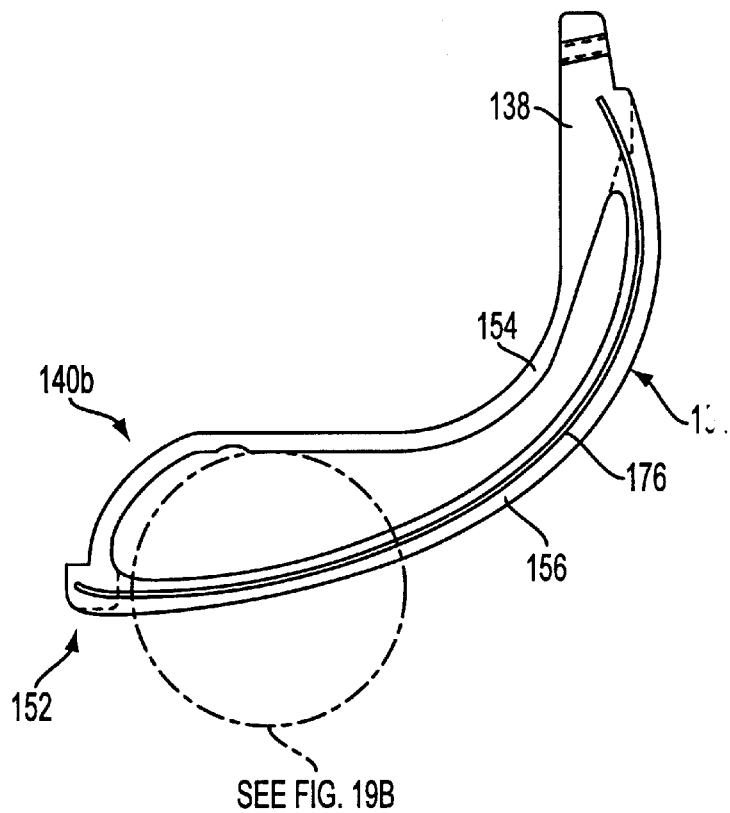
FIGS. 19a and 19b are an end view, and an enlarged view taken substantially of the area within circle 19b—19b, respectively of the other shield body of the shield assembly of FIG. 16.
Figure 19B:
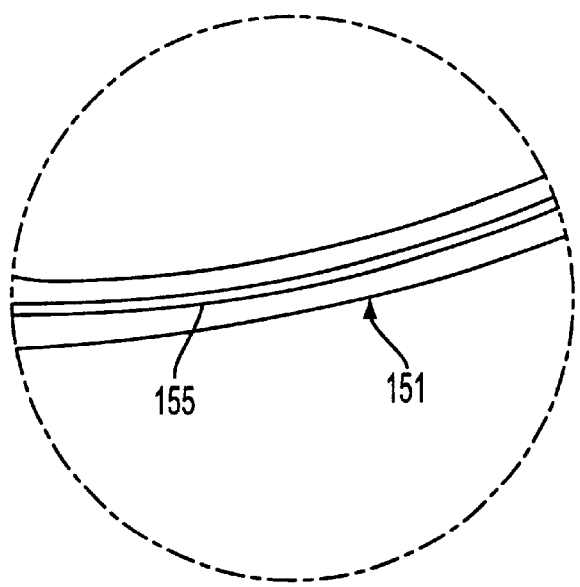

FIG. 19a and 19b show another shield body 140b according to this alternative embodiment of the present invention. Shield body 140b is similar to earlier described shield body 40b in shape and function. As with shield bodies 40a and 40b, shield bodies 140a and 140b cooperate to define the back wall of the shield assembly which is positioned against the front face of the injector to wrap around the outer edges of the injector. Since shield bodies 140a and 140b are substantially identical, although reversed relative to one another, only one shield body 140b is described in detail below. Shield body 140b includes a perforated sheet or screen 176 which is bent or pre-formed to a desired shape. The sheet stands away from the base of the shield body 140b to form the plenum 78, which receives the gas supply device such as the metering tubes 80. As in the earlier described embodiment, the sheet 176 preferably has a thickness in the range of 0.005 to 0.012 inches, for example 0.008 inches.

Again as shown, the shield body 140b is no longer formed of only a base, but now the base 138 includes a continuous unit frame 151. In this embodiment, the unit frame 151 includes spaced apart end sections 152 and 153, and top 154 and bottom 156 sections extending longitudinally between the end sections. That is, the base 138 includes a continuous unit frame 151 and end sections 152 and 153 at each end of the base, and these end sections define the perimeter of the shield body 140b at its ends.

The sheet 76 is carried in a longitudinally extending slot or slit 155 formed in the unit frame. The slot 155 is shown in more detail with reference to FIGS. 19a and b. The slot substantially conforms to the shape of the sheet 176. The perforated sheet 176 is inserted into a slot or slit 155 formed in the unit frame 151, and similar to that shown in FIG. 18, the sheet 176 is inserted through one end section of the unit frame 151, alone the top and bottom sections and into the opposite end section. The slot extends all the way through one or both of the end sections in order to receive the sheet 176. Consequently, the sheet is held along its entire length and ends in the frame, and not only along its ends as in the earlier described embodiment. While the earlier described embodiment is a significant improvement to the prior art, this new embodiment is the preferred embodiment. This frame construction allows for easier insertion of the sheets, and provides a stronger shield body. The frame construction also simplifies assembly of the shield and reduces the number of parts. The frame 151 increases the rigidity of the shield assembly. The slot 155 is sized such that, at temperatures near room temperature, there is a gap between the perimeter of the sheet 176 and the boundaries of the slot within the frame. At the elevated operating temperatures, which are typically greater than 400° C., the perforated sheet 176 can expand causing its ends to substantially fill the slot 155, and the screen and slot are sized such that the gap around the perimeter of the screen within the frame permits expansion of the screen within the frame without distorting the shape of the screen or shield body. The screen and shield body maintain their contoured shapes which in turn maintain the desired flow characteristics of the shield assembly.

In an alternative embodiment of the present invention, a bottom outlet screen or sheet 160 is present in the bottom of the base of shield bodies 140c and 140d. In this embodiment, the screen 160 is used instead of the bottom outlet port 58 previously described. Preferably, the bottom outlet screen 160 is a perforated sheet similar to the sheets 176 and 198. Specifically, the bottom outlet screen 160 is positioned in the bottom of the base 139 and extends along at least the partial length of the shield body 140c. Preferably, the bottom outlet screen 160 extends along the entire length of the shield body, however, this may vary depending on the amount of outflow of inert gas desired in this region. The bottom outlet screen 160 provides for the flow of inert gas through the screen 160 to the area below the screen.

In this embodiment, the bottom outlet screen 160 is secured to the base via the unit frame 141. Thus, in this embodiment, the bottom surface of the base is not substantially solid with an outlet port 58 as in the earlier described embodiment, but instead is substantially open, with its perimeter defined by the continuous unit frame 141. In this embodiment the frame 141 includes a second slot 175 formed in the unit frame 141 to receive and secure the outlet bottom screen 160. Thus, when the bottom outlet screen 160 is inserted into the bottom of the base and carried by the unit frame 141, the bottom of the base is "closed" with the perforated bottom outlet screen 160. The slot 175 in the unit frame 141 is substantially similar to the earlier described slots 145 and 155. That is, the slot is formed partially through the side sections to receive and seat the long sides of the sheet 160. At least one, and preferably two, of the end sections 142 and 143 has the slot 175 running all the way through the wall so that the screen 160 can slide though the end section and into the side sections and opposite end section of the unit frame 141.

The bottom outlet screen 160 causes a flow of inert gas from the plenum 100 though the base to the area below the shield adjacent the bottom outlet screen 160. This provides a buffer of inert gas in the region below the shield bodies 140c and 140d, thus substantially preventing the reagents and reaction by-products from leaving the deposition zone 16. Further, the inventors have found that when higher flow rates are encountered the bottom outlet screen embodiment is more preferred than the outlet port embodiment. The bottom outlet screen is better at preventing recirculation in the adjacent region, especially at higher flow rates.

Of particular advantage, the porosity of the sheets may be varied, for example to achieve a certain desired proportion of the flow within the plenum 100 to exit the plenum 100 through the bottom screen 160 verses the upper screen 198 as the case may be. That is, the porosity of any one of the perforated sheets, 178, 196 and 160 may be selected to achieve a certain flow split (or mass flow rate) of inert gas into the regions adjacent the sheets and to provide an appropriate flow balance in the chamber and metering uniformity across a full surface area. The porosity of the sheets may be selected to tailor the flow in the adjacent region. Specifically, the porosity of the sheets is equal to or less than 50%, and more preferably in the range of about 5% to 50%. In the preferred embodiment the porosity of the bottom outlet screen 160 is greater than the porosity of the other sheets 178 and 196. For example, the porosity may be selected to be 9% for sheets 176 in shield bodies 140a and 140b; 5% for sheets 198 in shield bodies 140c and 140d; and 35% for bottom outlet screen 160 in shield bodies 140c and 140d.

Of further advantage, another embodiment of the present invention provides for the use of at least one vent sleeve. Referring again to FIG. 16, vent sleeves 180 and 181 are shown in a cross sectional view of the shield assembly 112. Preferably, the sleeve 180 and 181 is a narrow, elongated member. The vent sleeves are positioned within the exhaust ports 50 of exhaust vents 32. The vent sleeves act to provide a contour to the walls of the exhaust ports 50 which minimizes recirculation of the gases as they travel through the exhaust ports 50 and out of the exhaust vents 32. Minimizing recirculation of the gases also minimizes the accumulation of deposits in the region.

Preferably, two vent sleeves are employed in the exhaust port 50; one vent sleeve 180 being adjacent to the outer wall of the exhaust port 50, and referred to as an outer vent sleeve. The other vent sleeve 181 is adjacent the inner wall of the exhaust port 50 and is referred to as an inner vent sleeve. The vent sleeves may extend partially or substantially along the height of the exhaust port 50. The two vent sleeves 180 and 181 may be equal in height, or each may be of a different height, suited to the specific geometry of the exhaust port 50 to streamline the flow from the transition of the exhaust port to the vent assembly. The vent sleeves may extend longitudinally along a substantial, or partial, length of the exhaust port 50.

In the preferred embodiment, one or both of the vent sleeves extend substantially along the full length of the exhaust port 50.

The vent sleeves 180 and 181 may be secured in a variety of ways. The sleeves may be affixed to the walls of the exhaust port such as by welding or bolting, and the like. Preferably however, the sleeves are not rigidly affixed, but are instead secured in a "free floating" manner similar to that described above. Specifically, the manner of attachment is shown with reference to FIG. 16. The outer vent sleeve 180 is preferably attached by inserting one end of the sleeve 180 into a slot or slit 180a carried in the side walls 164. The slot 180a extends longitudinally along the length of the side wall 164. The slot 180a has a width such that it securely holds the vent sleeve 180, and an insertion depth to permit the sleeve to expand during elevated operating temperatures. In addition to allowing for the components to expand and contract with temperature and thereby minimizing buckling and warpage, the present invention allows for the easy removal and replacement of the vent sleeves. The inner vent sleeve 181 may be similarly attached, such as secured with a slot formed in the shield frame 138, or bolted on the shield frame 138.

The frame construction embodiment just described also provides for convenient attachment to the end wall 162. The end wall is shown in FIGS. 20a and 20b, which illustrate the inner and outer surface, respectively, of one end wall 162.

In the preferred embodiment, the shield bodies 140a–140d are not affixed or welded to the end walls 162, and the perforated sheets 176, 198 and 160 are not affixed or welded to the unit frames or ends walls 162. Instead, the shield bodies and sheets are held in place in a manner which allows movement of the shield bodies and sheets relative to each other, as well as to the shield assembly and the end walls. Specifically, the interior of at least one, and preferably both, of the end walls 162 are shaped to hold the end sections 142, 143 and 152, 153 of the unit frames 141 and 151.

Figure 20A:
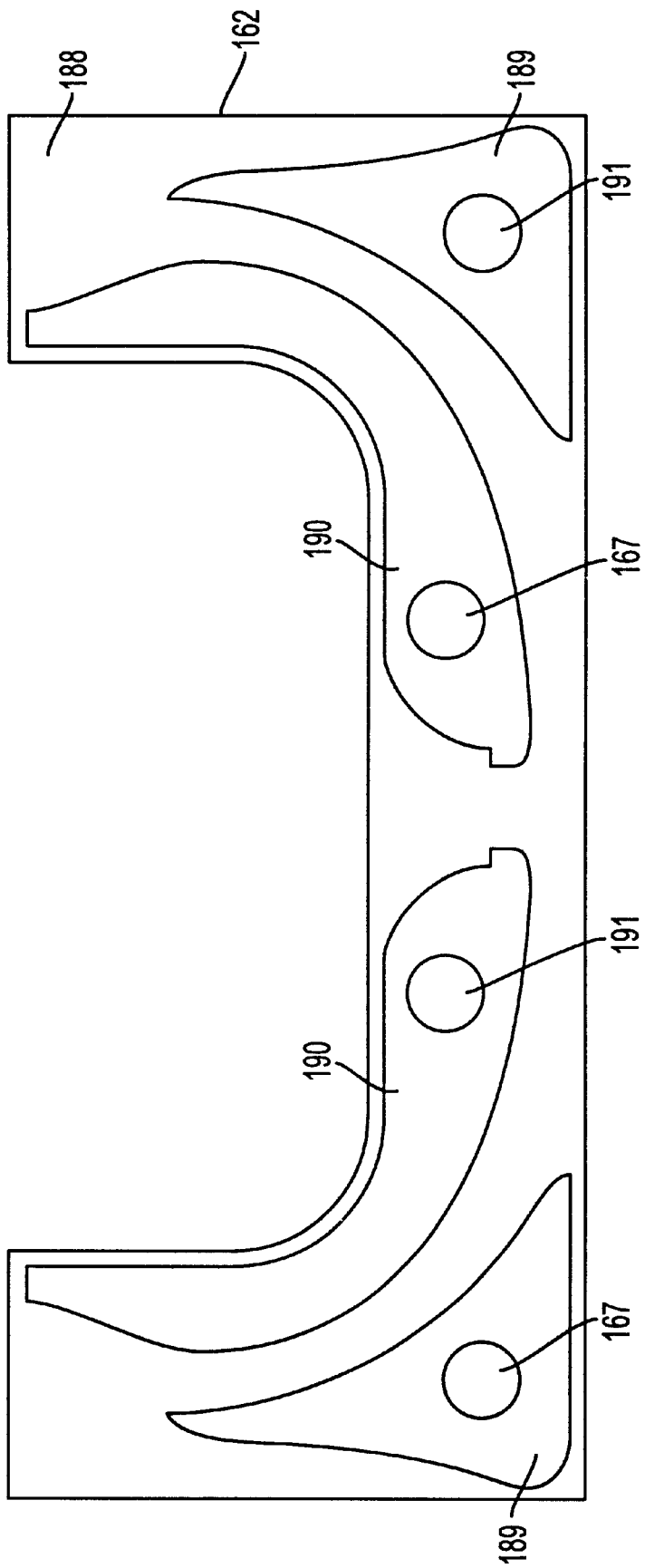
FIG. 20a is a front plan view of the inside of an end wall of the shield assembly of FIG. 16.
Figure 20B:
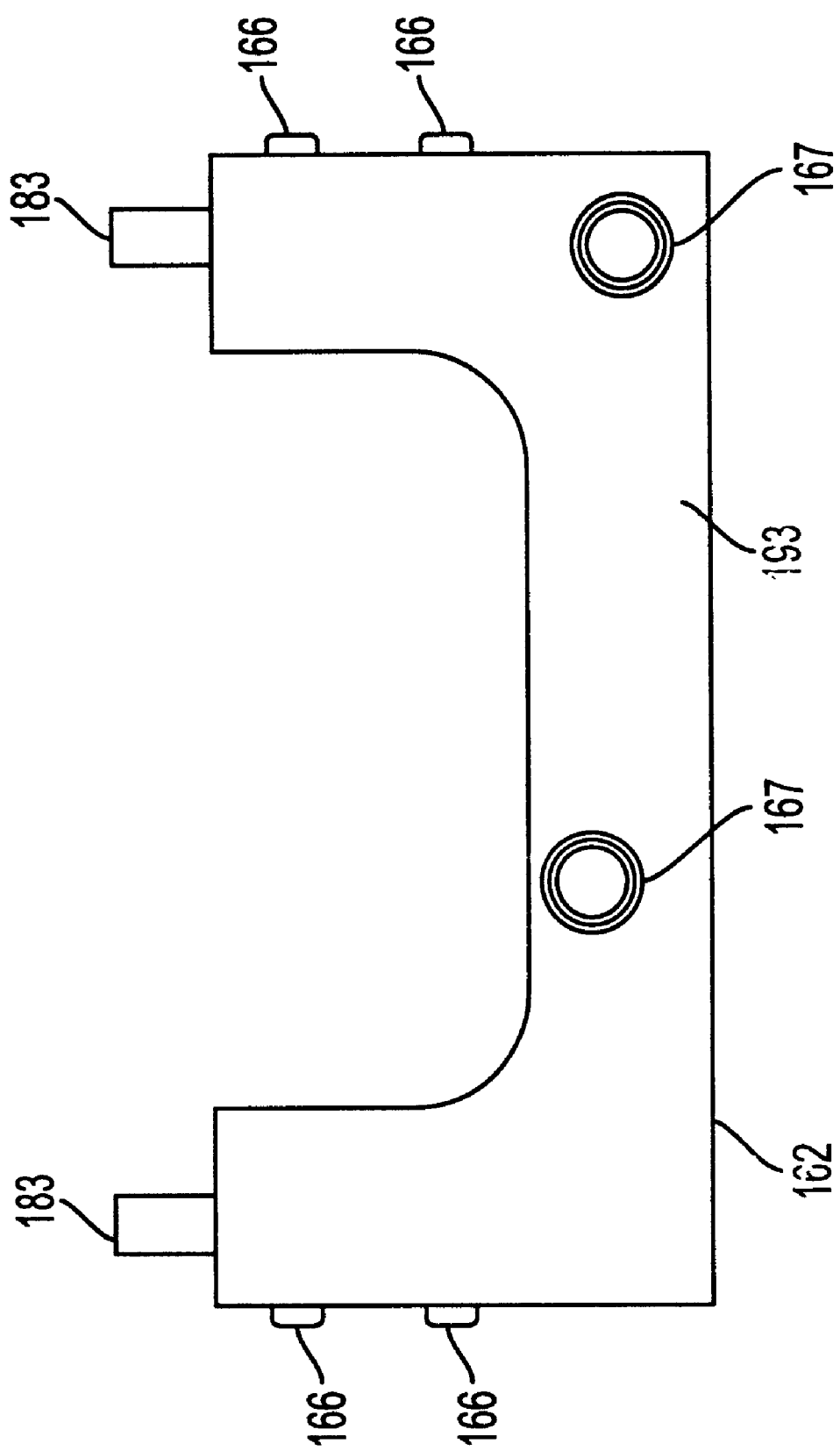

As shown in FIG. 20a, the inner surface 188 of end wall 162 includes recessed areas which conform to the shape of the end sections of the unit frames. Specifically, the inner surface 188 has recessed areas 189 which conform to the shape of the end sections 142 and 143 of the unit frames 141, and recessed areas 190 formed therein which conform to the shape of end sections 152 and 153 of unit frame 151. Note that only one end wall 162 is shown in the figure, but that the opposite end is similar. The shield bodies 140a–140d are seated in their respective recessed areas 189 and 190 to couple the shield bodies to the end walls 162. The walls of the recessed areas 189 and 190 substantially seal the ends of the shield bodies, thereby preventing flow of gas around the end of the shield bodies. Since the sheets are seated in the unit frames, in this embodiment the end walls 162 need only capture the ends of the unit frames, and thus the end wall contains only the recessed area 189 and 190. In the earlier described embodiment, the sheets were also captured by channel 88 formed in the end walls 62.

To permit free expansion of the shield bodies, the recessed areas 189 and 190 in the end walls 162 have a depth such that, at temperatures near room temperature, there is a gap between the end sections of the unit frame to the closed end of the recessed areas 189 and 190. At the elevated operating temperatures, which are usually greater than 400° C., the unit frame and its end sections can expand, causing the end sections 142 and 152 of the unit frame 141 and 151 to substantially fill the recessed regions 189 and 190, respectively. The end sections 142 and 152 of the unit frames 141 and 151 have an insertion depth of approximately 0.150 inches, and the recessed areas 189 and 190 have a depth of approximately 0.200 inches to accommodate the insertion depth of the end sections while allowing for expansion.

Of particular advantage, the present invention also provides for "free floating" metering tubes. As described above, metering tubes are employed to convey inert gas to the various plenums. One end of the metering tube is attached to a gas supply via through holes contained in one end wall. The opposite end of the metering tube is closed. The closed end of the metering tube is carried in the end wall 162. Specifically, the end wall 162 includes at least one well 191 formed in the inner surface of the end wall as shown in FIG. 20a. The well 191 receives the closed end of the metering tube. The closed end of the metering tube is aligned in the well 191 and the depth of the well 191 is such that the metering tube may freely expand and contract and remain securely placed within the well 191. In the exemplary embodiment, there are four wells 191, two on each end wall 162, which correspond to the four metering tubes, one placed in each of the plenums of shield bodies 140a–140d.

The outer surface 193 of one of the opposite end wall 162 is shown in FIG. 20b. This end wall 162 receives the inlet gases for the two metering tubes terminating in the end walls 191 depicted in FIG. 20a. As shown, gas is delivered to the end wall 162 via gases supply tubes 183. The gas flows through internal passages formed in the end wall and enters the metering tube 80 and/or 102. At this end wall 162 the metering tubes are inserted into the end wall 162 via through holes 167. This allows for easy removal of the metering tubes. The metering tubes are held at the opposite end via wells 191 as described above. The end walls 162 also include outward projecting dowels 166 which assist in the assembly of the shield by providing the correct alignment and spacing of the end wall when the side walls are attached.

Figure 21:
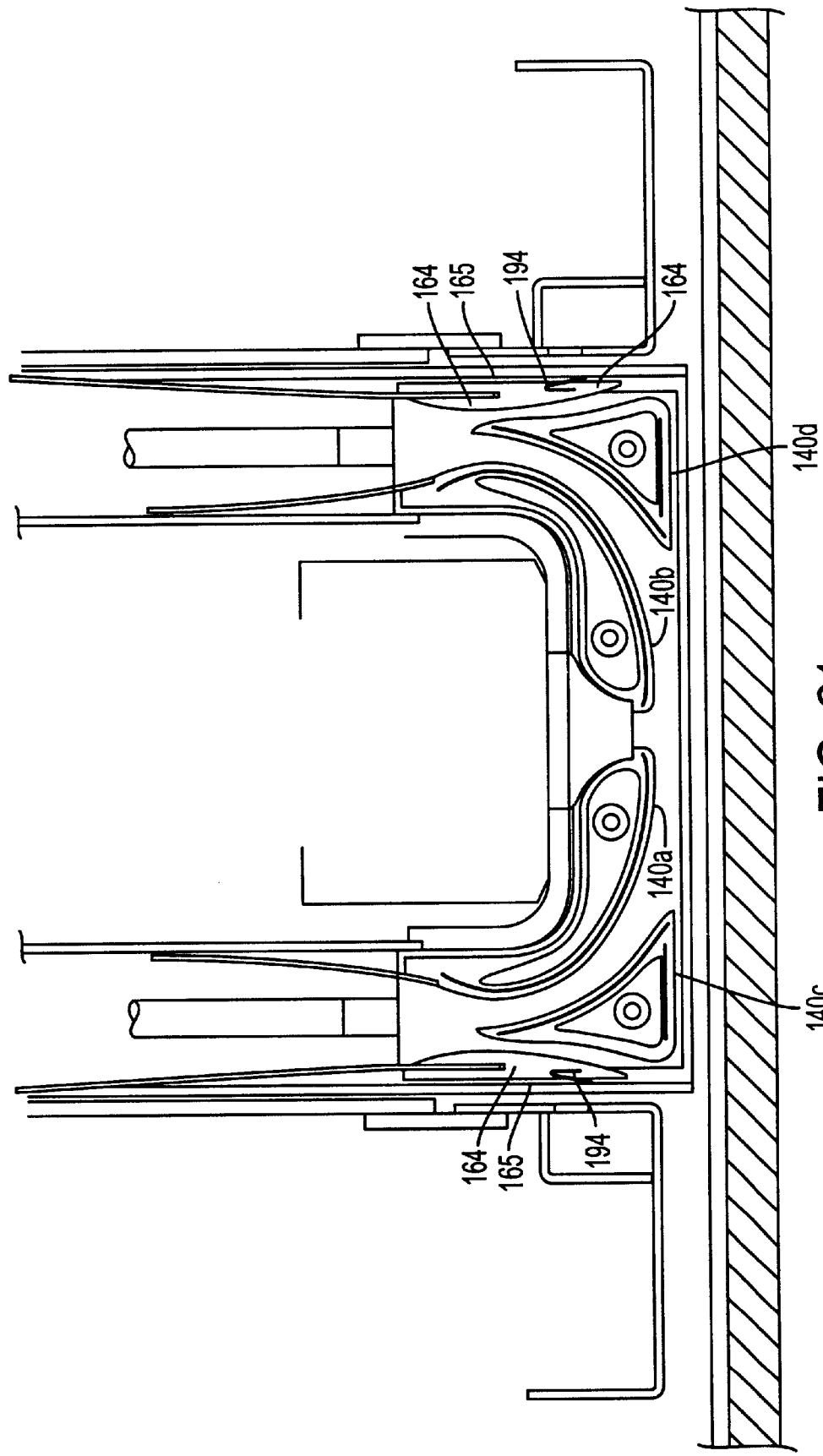
FIG. 21 is a cross sectional view of the shield assembly of FIG. 16, showing the vent shield assembly assembled in a vent shroud.

To securely attach the shield assembly 112 to the chamber, one embodiment of the present invention provides for using a removable seal. Specifically, a vent wall shim 194 is used to provide a seal between the side walls 164 to a vent shroud 165 as shown in FIGS. 16 and 21. Of particular advantage, the shim 194 is not rigidly attached which provides for easy removal and replacement of the seal 194. Specifically, the seal 194 is formed preferably of a metal alloy such as stainless steel and the like, and is bent or preformed such that the shim fits between the side wall 164 and the vent shroud 165.

Figure 22A:
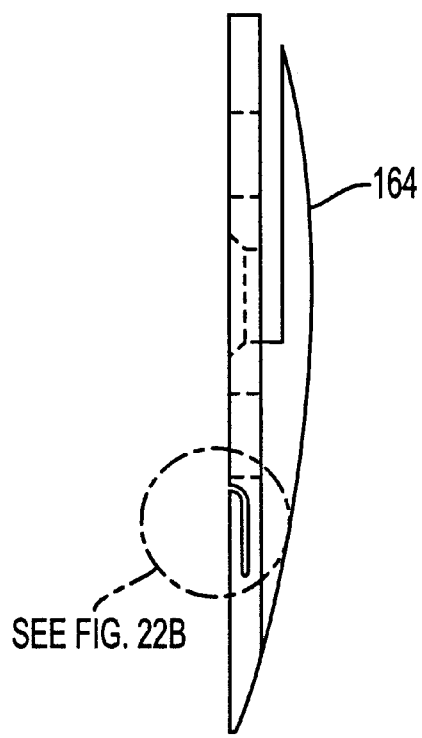
FIGS. 22a and 22b are an end view, and an enlarged view taken substantially of the area within circle 22b—22b, respectively, of one of the side walls and shim seal of the shield assembly of FIG. 16.
Figure 22B:
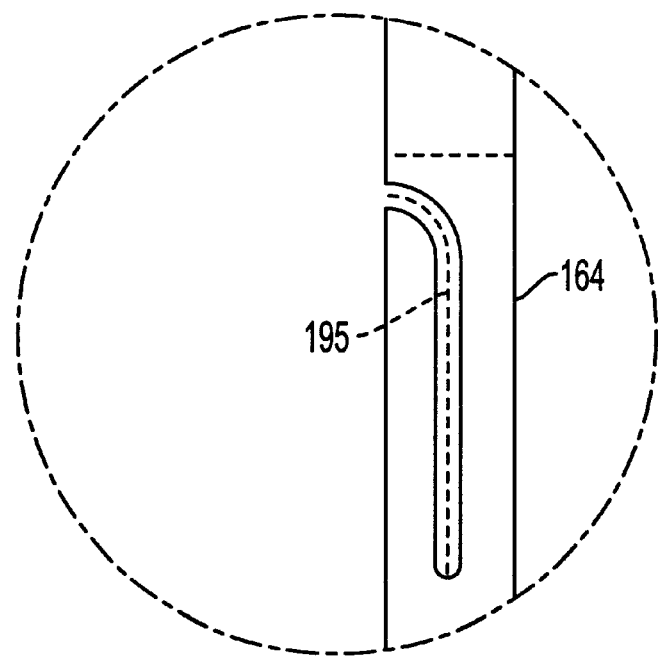

The shim seal 194 is carried in the side walls 164 as shown in greater detail in FIG. 22. Specifically, a slot 195 is formed in the side wall 164, and preferably the slot 195 extends substantially along the length of the side wall 164. The slot 195 is formed of a shape that substantially conforms to a portion of the shim seal 194. Of particular advantage, the shim seal 194 is simply inserted into the slot 195 from one end of the vent wall 164 and is slid through the slot 195 until fully inserted. The shim seal 194 provides a seal between the side wall 164 and the vent shroud 165.

Figure 23:
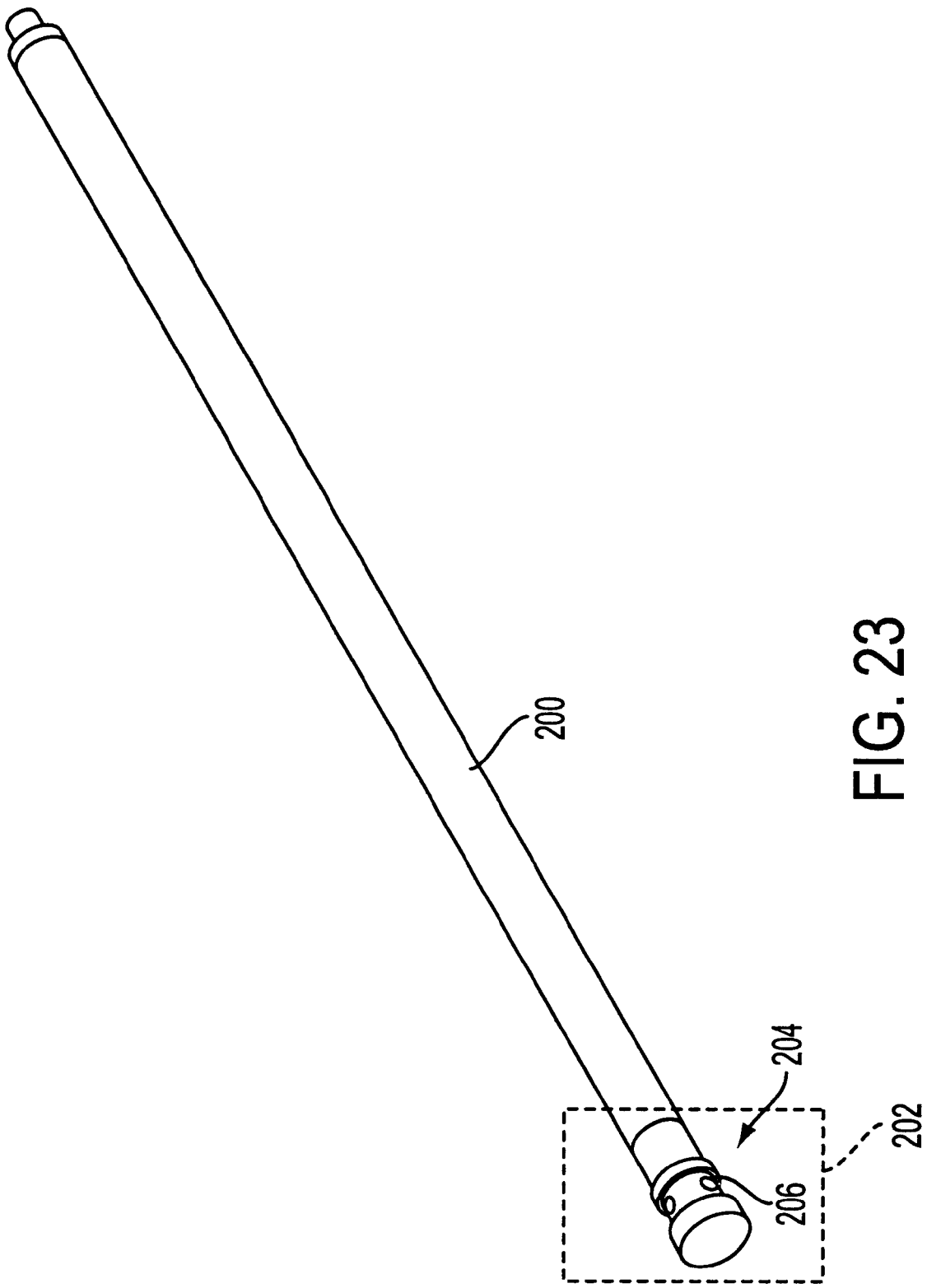
FIG. 23 is a pictorial view of a metering tube including a flange in accordance with an alternative embodiment of the present invention.

To provide the inert gas to the various plenums, metering tubes 80 and 102 are employed. An alternative embodiment of the metering tubes are shown in FIG. 23. In FIG. 23, the metering tube 200 employs a flange 202 at one end of the metering tube 200. The flange 202 includes a sealing region 203 and a circular recessed region 204. The recessed region 204 is a plenum area. That is, the recessed region 204 contains a plurality of holes 206 spaced around the circumference of the recessed region 204. The holes 206 act to convey gas received from the gas inlet tube 183 and fitting 184, where the gas distributes around the circumference of the recessed region and into the metering tube 200. The metering tubes may be made of a metal or metal alloys or ceramic materials, such as alumina, nickel, stainless steel, aluminum or silicon carbide and the like, with stainless steel being the preferred material.

An alternative embodiment of the shield shown in FIGS. 16 through 23 is illustrated in FIGS. 27 through 31. The shield bodies 240a–240d have a "frame construction" of the type previously described. Each of the shield bodies 240a–240d includes a base 246a–246d that is formed of a single piece of material, with end frames 247a–247d. The shield bodies 240c and 240d include tie members 248c and 248d which joins the ends of the frames 247c and 247d. Each of the shield bodies and the tie members include grooves 249 which extend longitudinally along their edges, and register with slots 250 formed in the end frames 247.

The shield bodies 240a and 240b accommodate at least one perforated sheet 251 which slides through the slots 250 and along the grooves 249 to form a plenum 252 between the base and the perforated sheet 251. A gas delivery device 253 delivers inert gas to the plenum at a flow rate such that the gas diffuses through the perforated sheet. The shield bodies 240c and 240d accommodate two perforated sheets 256, 257 which slide through slots 250 along grooves 249 to form a plenum 258. A gas delivery device 259 delivers inert gas to the plenum 258 at a flow rate such that it diffuses through the perforated sheets 256, 257. The shield body assemblies are captured in the recesses 261 formed in the end walls 262, FIG. 31. Thus, the perforated sheets can freely expand and contract relative to the shield body and the shield body can freely expand and contract relative to the end walls. The shield assembly and its components are made of a metal alloy, such as stainless steel and commercially available alloys such as Haynes 214, Inconel and Kovar, and the like. Further, the shield assembly and at least one of its components may be treated by an oxidation process as described in U.S. Pat. No. 5,916,378 Issued Jun. 29, 1999, the description of which is incorporated by reference herein in its entirety. The oxidation treatment provides components that are less susceptible to corrosion, and minimizes contamination. Preferably, the shield assembly is made of a combination of stainless steel parts and oxidized Haynes 214 parts. It is preferred to use oxidized Haynes 214 material for parts that are within the wafer path and are exposed to temperatures exceeding about 350° C., such as shunt shield bodies 240c and 240d.

The shield bodies 240a and 240b include a vent shield portion 263 which extends upwardly adjacent the inner wall of the exhaust port. Side walls 264 extend between the end walls 262 with their ends suitably secured to the sides of the end walls to form therewith a frame which retains the shield bodies 240a–240d in the recesses 253. The side walls each include a vent shield portion 266 which extends upwardly adjacent the outer wall of the exhaust port. The side walls 264 fit along the sides of the shield bodies 240c and 240d. The vent shield portions 263, 266 are shaped to form a smooth transition between the exhaust opening or gap between the shield bodies 240a, 240c and 240b, 240d and the exhaust. The smooth contour minimizes turbulent flow of the exhaust gases which flow through exhaust opening 116.

As described above, the perforated sheets 251, 256 and 257 are inserted through the slots 250 and along the grooves 249. The end edges of the sheet are seated in the slot, and the side edges of the sheets are in the grooves. This permits expansion and contraction of the sheet. The shield body construction allows for easier insertion of the sheets, and provides a stronger shield body, seals the screens or perforated sheets within a single unit frame part thereby reducing the total number of parts and complexity of the assembly. In other words, the screens are now sealed by a single part, the continuous unit frame, instead of by multiple parts as in the earlier described embodiment. At the elevated operating temperatures, which are typically greater than 400° C., the perforated sheets can expand causing their ends to substantially fill the corresponding slots 249, and the screens and slots are sized such that the gap around the perimeter of the screen within the frame permits expansion of the screen within the frame without distorting the shape of the screen or the shield body. The screen and shield body maintain their contoured shapes which in turn maintain the desired flow characteristics of the shield assembly.

Of particular advantage, the porosity of the sheets may be varied, for example to achieve a certain desired proportion of the flow from the plenums 252, 258. That is, the porosity of any one of the perforated sheets 251, 256 and 257 may be selected to achieve a certain flow split (or mass flow rate) of inert gas into the regions adjacent the sheets and to provide an appropriate flow balance in the chamber and metering uniformity across a full surface area. The porosity of the sheets may be selected to tailor the flow in the adjacent region. Specifically, the porosity of the sheets is generally equal to or less than 50%, and more preferably in the range of about 5% to 50%.

Figure 31:
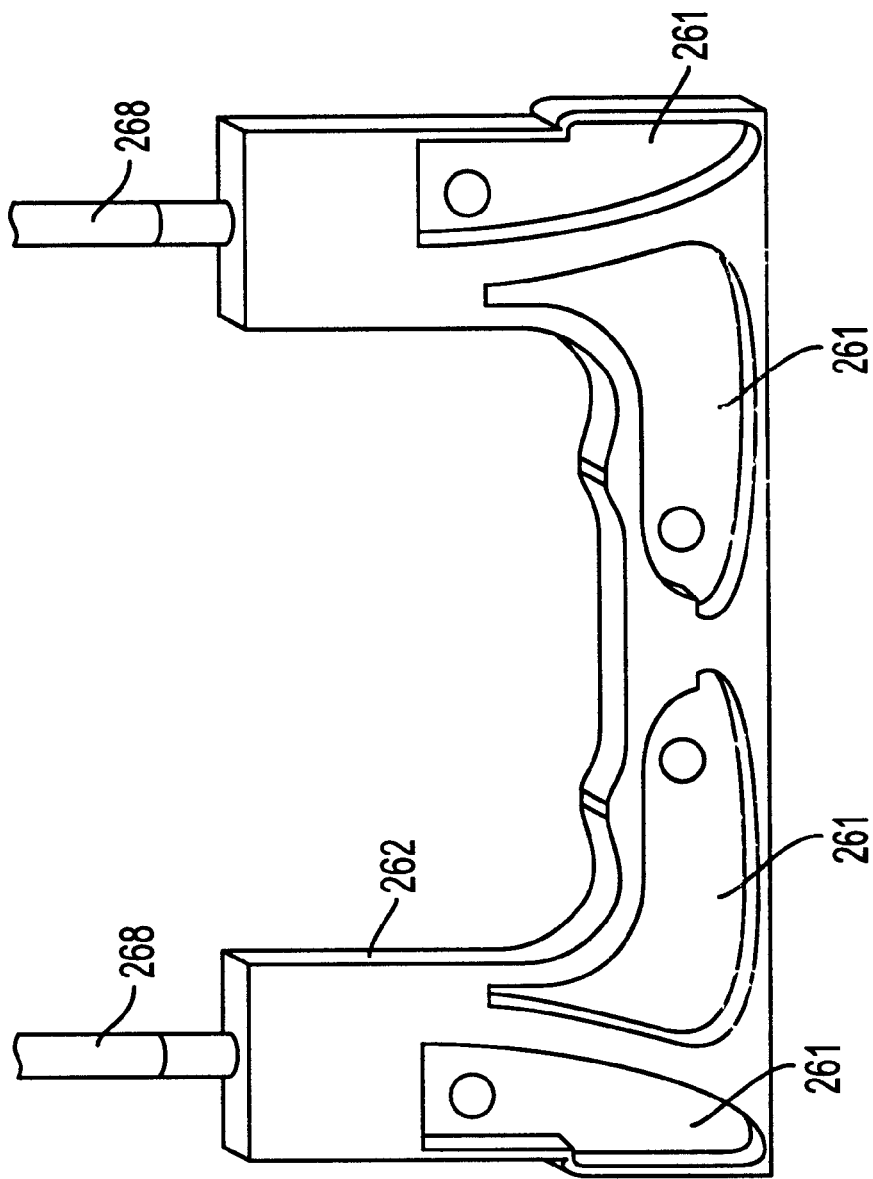
FIG. 31 is a perspective view of one of the end walls of the shield assembly of FIG. 27.

As described above, the inner surface of end walls 262 includes recessed areas 261 which conform to the shape of the end sections of the frames of the shield bodies 240a–240d. Specifically, the inner surface has recessed areas which conform to the shape of the ends of the shield bodies 240a–240d. Note that only one end wall 262 is shown in FIG. 31, but that the opposite end is similar. The shield bodies 240a–240d are seated in their respective recessed areas 261 to couple the shield bodies to the end walls 262. The walls of the recessed areas substantially seal the ends of the shield bodies, thereby preventing flow of gas around the end of the shield bodies. Since the sheets are seated in the unit frames, the end walls 262 need only capture the ends of the unit frames, and thus the end wall contains only the recessed areas.

To permit free expansion of the shield bodies, the recessed areas 261 in the end walls 262 have a depth such that, at temperatures near room temperature, there is a gap between the ends of the shield bodies and the closed end of the recessed areas. At elevated operating temperatures, which are usually greater than 400° C., the shield bodies can expand, causing them to substantially fill the recessed regions.

As described above, metering tubes are employed to convey inert gas to the various plenums. One end of the metering tube is attached to a gas supply via through holes contained in one end wall. The opposite end of the metering tube is closed. The closed end of the metering tube is carried in one end wall 262 which includes at least one well (not shown) formed in the inner surface of the end wall. The well receives the closed end of the metering tube. The depth of the well is such that the metering tube may freely expand and contract and remain securely placed within the shield body frame. In the exemplary embodiment, there are four wells, two on each end wall 262, which correspond to the four metering tubes, one placed in each of the plenums of shield bodies 240a–240d. Gas is delivered to the end wall 262 via gas supply tubes 268. The gas flows through internal passages formed in the end wall, and enters the metering tubes 253. At this end wall, the metering tubes are inserted into the end wall 262 via through holes. This allows for easy removal of the metering tubes. The metering tubes are held at the opposite end via wells.

Figure 15:
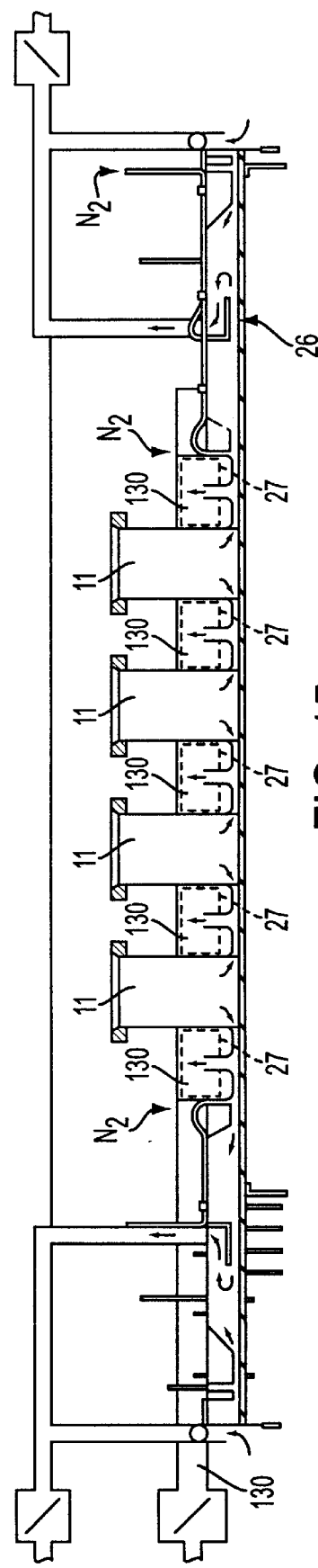
FIG. 15 is a schematic view of a new CVD system process muffle enabled to exhaust excess chamber gas out buffer modules while ensuring safe containment of process gases through use of the new shield.

In another embodiment of the present invention, a new muffle design is provided. The muffle design is illustrated in FIG. 15 as described above and is shown, along with the path of the gas exhaust flows in greater detail in FIGS. 24a, 24b and 25. The muffle 26 includes at least one process module 111 which is surrounded by adjacent buffer modules 127. The exemplary embodiment shows four process modules 111 and five buffer modules 127, however it should be understood that any number of process modules and buffer modules may be used and will vary depending on the design of the muffle and reactor. At one end of the muffle 26 there is a load region 29, and at the opposite end of the muffle there is an unload region 31. The load region 29 is configured to receive wafers and integrated circuits for processing.

Typically, an automatic load mechanism (not shown) is employed to place the wafers into the load region 29 of the muffle 26. Wafers are conveyed through the muffle by a conveying means. Preferably, the conveying means is a motor driven wire mesh belt, however any suitable conveying means may be used. The wafers pass through the muffle 26 and underneath the process modules 111 where the wafers are processed. The wafers then exit the muffle 26 through the unload region 31.

Preferably the load 29 and unload 31 regions employ a plurality of curtains. Specifically, in the preferred embodiment, the load region 29 includes three curtains 33; namely a outer load curtain 33C, center load curtain 33B, and inner load curtain 33A. Similarly, the unload region 31 includes three curtains 35; namely an inner unload curtain 35A, center unload curtain 35B, and outer unload curtain 35C. The outer load 33C and unload 35C curtains are positioned at the end of the muffle 26 in the load and unload regions, respectively. The inner load 33A and unload 35A curtains are positioned adjacent the process modules 11 in each region, respectively. The center load 33B and unload 35B curtains are positioned in between the inner and outer load and unload curtains, respectively. The curtains act to isolate the process modules from the rest of the muffle, and from the exterior environment. The system is exposed to the exterior environment to facilitate easy loading and unloading of wafer substrates for processing in the muffle. Exposure to the exterior environment can introduce contaminants into the system. To prevent contamination from the load and unload ports and help isolate the chamber process modules from the external environment, the curtains 33 and 35 of the present invention provide an inert gas purge, which is preferably nitrogen gas. While the exemplary embodiment shows three curtains in each region, it is to be understood that other numbers of curtains can be used, and that the number of curtains in the load and unload regions may differ.

Figure 24A:
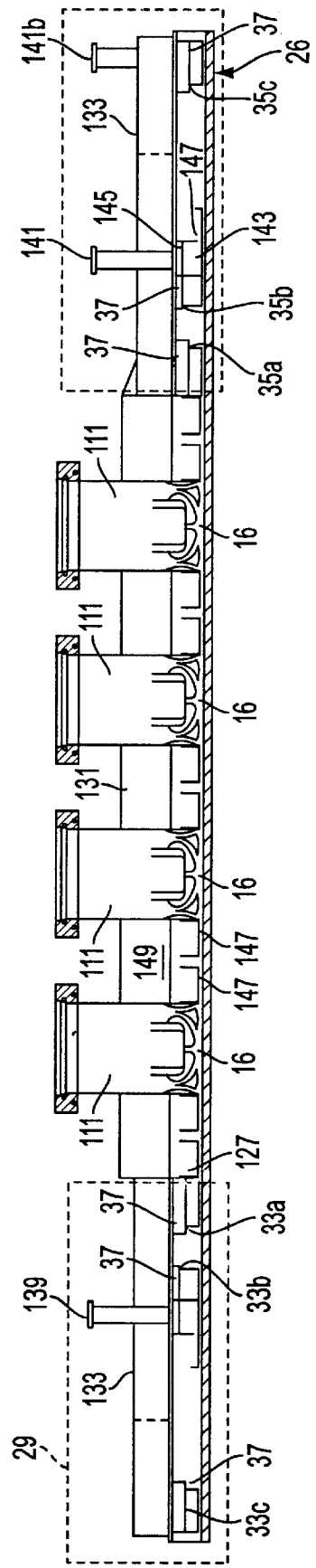
FIG. 24a and 24b are schematic views of a CVD system process muffle enabled to exhaust excess chamber gas out buffer modules while ensuring safe containment of process gases through use of the new shield.
Figure 24B:
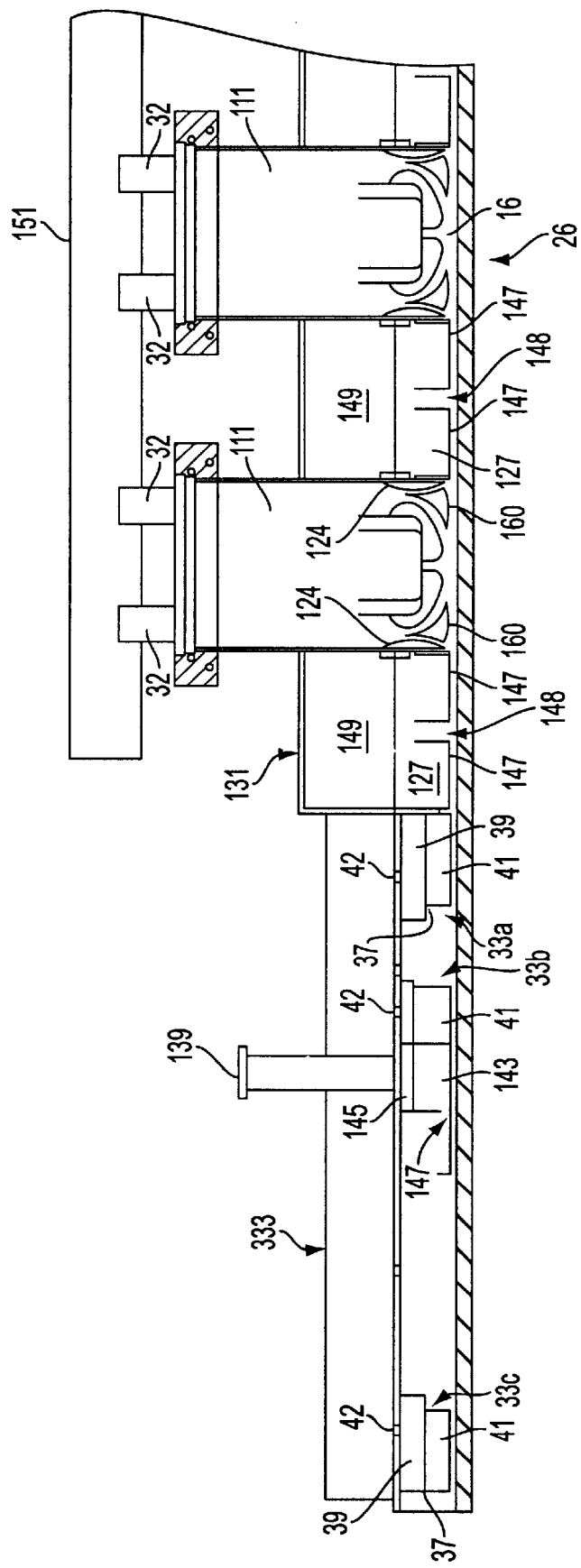

As shown in FIGS. 24a and 24b, the load and unload curtains 33 and 35 are generally comprised of a plenum body 37 having two plenum stages, and upper plenum stage 39 and a lower plenum stage 41. The plenum body 37 is elongated and extends longitudinally along the length of the muffle and is coextensive with the length of the buffer modules 27 and process modules 11. The upper plenum stage 39 receives inert gas through gas inlet 42. The lower surface of upper plenum stage 39 contains an array of distribution holes formed therein (not shown) comprised of at least one row of holes across the full length of the plenum body, though multiple rows of holes may be used to distribute the flow over the entire surface of the plenum. The inert gas passes into the upper plenum stage 39 and is conveyed through the distribution holes into the lower plenum stage 41. The bottom surface of the lower plenum 41 contains a narrow elongated slot. The slot extends along the length of the lower plenum 41. The inert gas is conveyed through the slot in the lower plenum to the region beneath the slot. The gas exits the slot in a long, thin curtain like sheet. This curtain of inert gas sweeps over the surface of the wafers passing beneath it, thereby "purging" the wafer surface. The curtain of inert gas also acts to isolate the process chambers 111 from the exterior environment and allows the pressure balance within the muffle to be adjusted through the use of different flow rates in the range of 5 to 75 slm. In the preferred embodiment, the inner curtains utilize lower flows around 5–10 slm, compared to the center curtains at 10–15 slm and the outer curtains at 30–60 slm.

The load and unload regions are separately exhausted via exhaust ports 139 and 141, respectively. The exhaust ports act to exhaust a substantial portion of the inert gas from the inner, center and outer curtains. Preferably, the load exhaust port 139 is placed adjacent the center load curtain 33B, on the side closest to the entry of the load region 29. Similarly, the unload exhaust port 141 is placed adjacent the center unload curtain 35B, on the side closest to the exit of the unload region 31.

Of particular advantage, the present invention provides for exhausting the gas in the load and unload regions in a metered fashion. That is, the exhaust ports 139 and 141 include two elongated plenum stages 143 and 145. Referring specifically to one exhaust port 139, the exhaust gas flow is directed through a slot 147 formed in the side of the first plenum stage 143. The exhaust gas is then conveyed through an array of metering holes (not shown) in the upper surface of the first plenum stage 143 to the second plenum stage 145. Preferably the array of metering holes is comprised of at least one row of holes across the full length of the plenum body, though multiple rows of holes in a rectangular array extending the substantial length of the upper surface of the first plenum 143 may be used to distribute the flow over the entire surface of the plenum. The gases are then conveyed out of the second stage plenum 145 through the exhaust port 139. The unload exhaust port 141 is the same.

Figure 26:
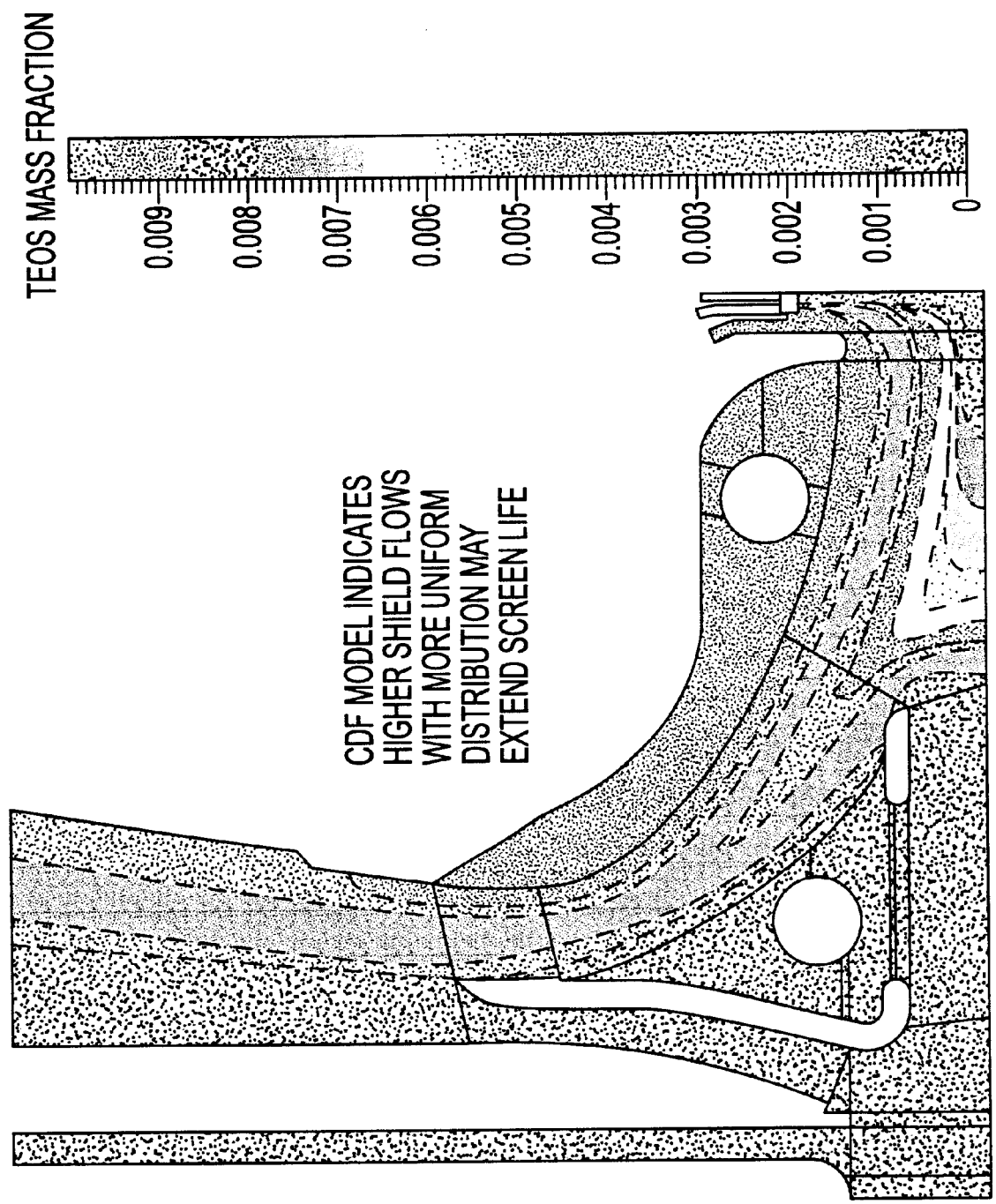
FIG. 26 is a cross sectional view of a portion of the shield assembly and injector illustrating the flow of gases.
Figure 27:
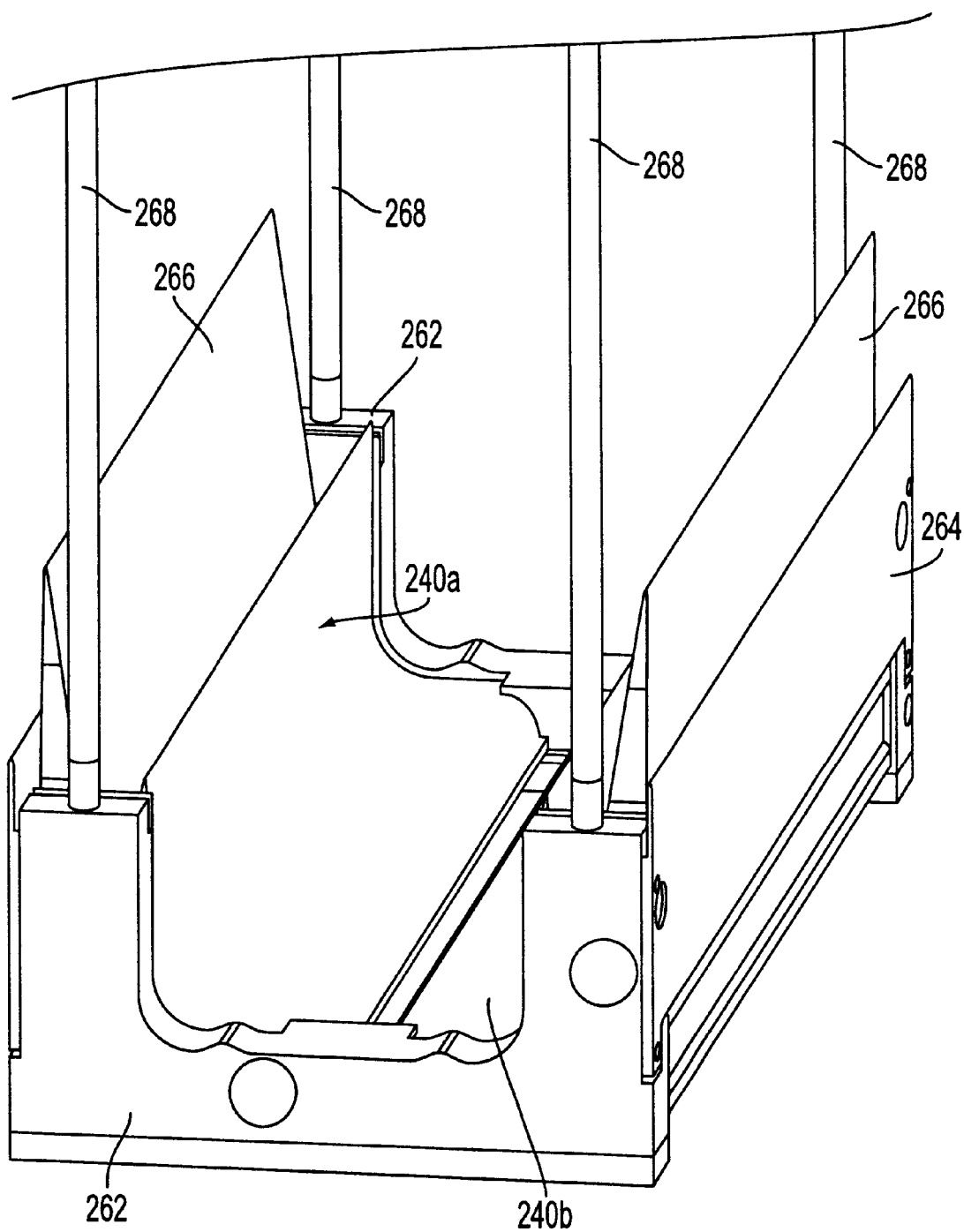
FIG. 27 is a perspective view of another embodiment of a shield assembly assembled in a vent shroud.
Figure 28:
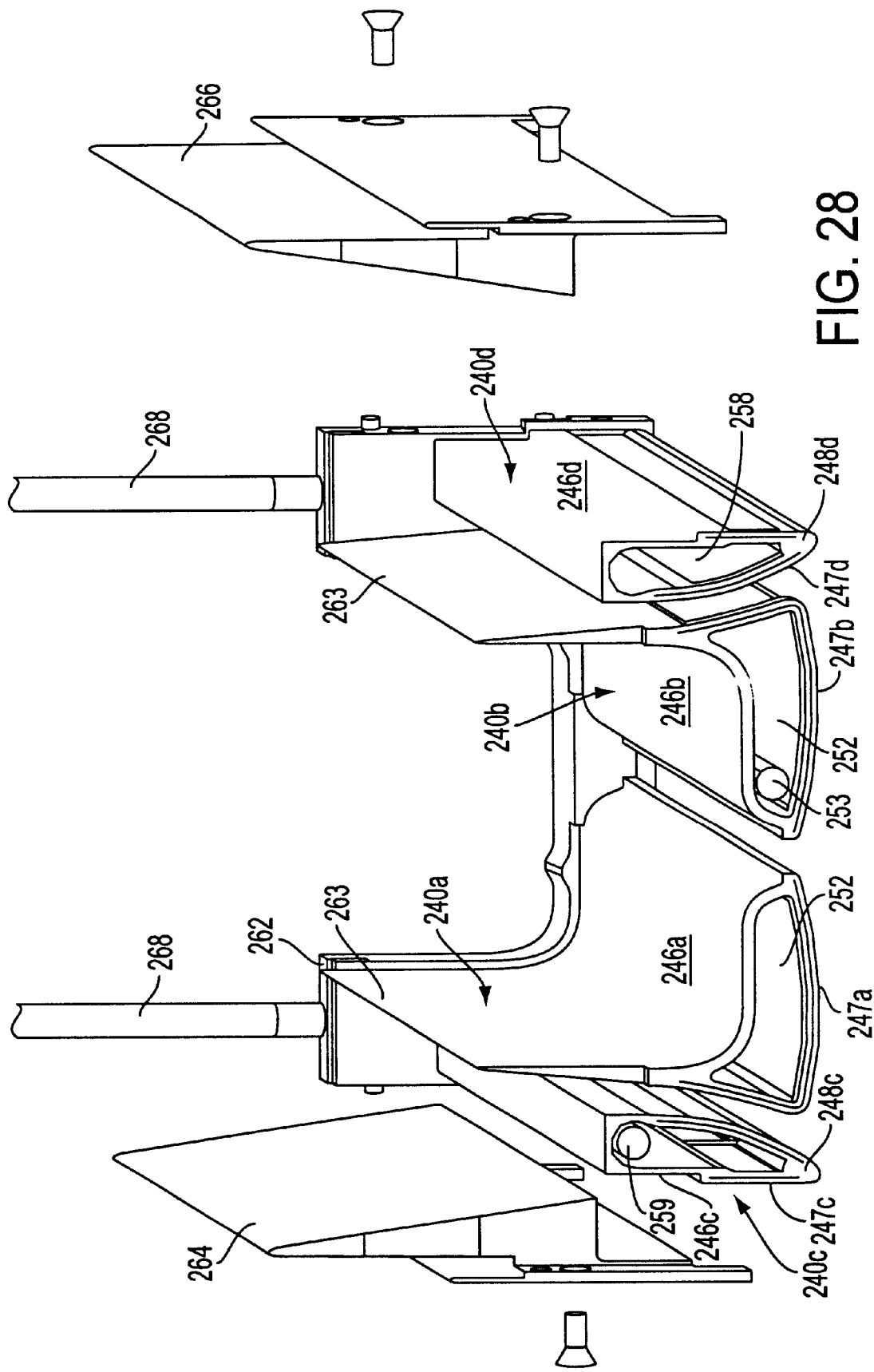
FIG. 28 is an exploded view of the shield assembly of FIG. 27.
Figure 29:
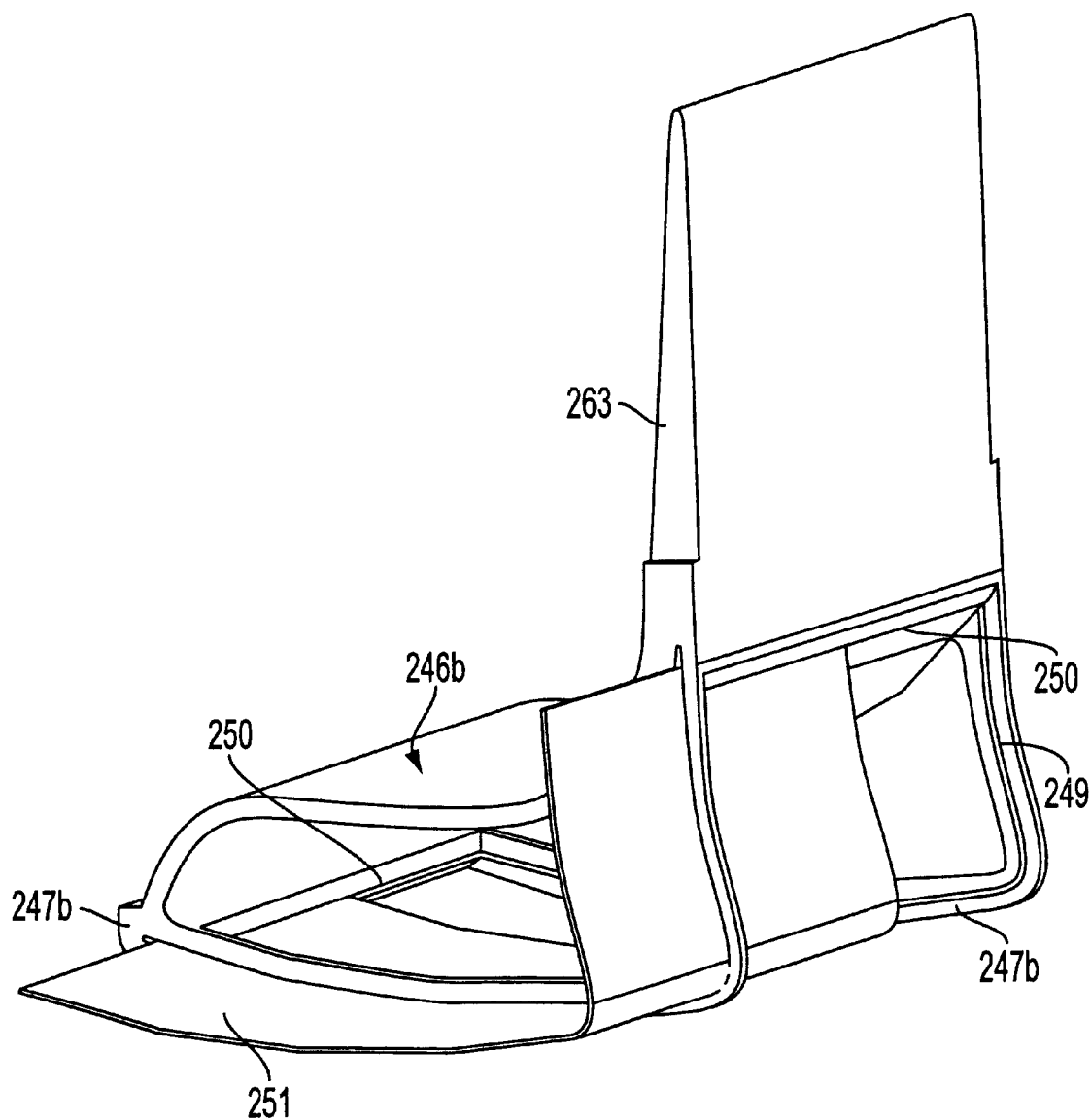
FIG. 29 is a perspective view of the vent frame of the shield assembly of FIG. 27.
Figure 30:
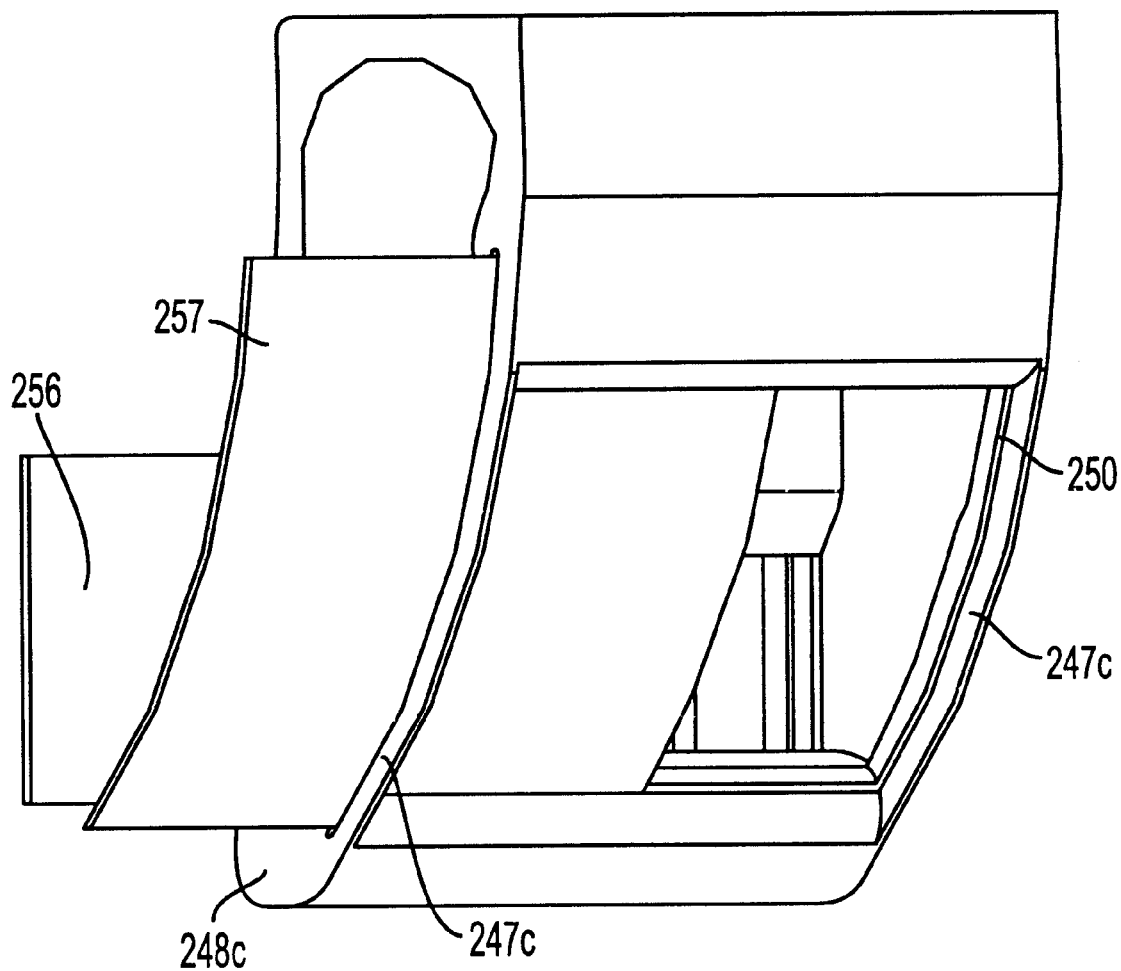
FIG. 30 is a perspective view of the shunt shield frame of the shield assembly of FIG. 27.

Of further advantage, the system of the present invention provides for buffer modules 127 that are independently exhausted. Specifically, the buffer modules 127 are positioned adjacent the process modules, one buffer module 127 on each side of the process module 111. The buffer modules 127 are elongated and extend longitudinally along the length of the process modules 111, and are generally coextensive with the process modules 111. The buffer modules are comprised of an elongated by-pass duct 131 having two elongated baffles 147 placed in the lower portion of the duct and a large cavity 149 above the baffles 147. The two baffles 147 are positioned adjacent one another and spaced apart to form a channel 148 therebetween. The channel 148 is elongated and extends the breadth of the by pass duct 131. The buffer modules 127 receive gas which is not accommodated by the exhaust vents 32. This excess inert gas flows into the buffer modules 127 between the process modules 111 and is removed from the muffle via by-pass ducts 131 through the bypass exhaust port 141b. The outermost buffer modules can also receive some of the inert gas flowing out of the inner load and unload curtains, or transfer flow from between the chamber process modules to the load region 29 or unload region 31 to be exhausted by ports 139 or 141 if not removed via the buffer modules. The by-pass ducts 131 are independent from the exhaust vents 32 of the process modules 111. The invention promotes containment of the reagents within the reaction chamber which are exhausted directly to the exhaust ports 50 and vents 32. No reagent or by-products are carried to the by-pass vents 131. Instead, a substantial portion of the inert gas conveyed through the bottom outlet screen 160 is exhausted through the by pass vents 131. This purposeful injection of excess inert gas through the bottom outlet screen 160, such that the amount beyond what is exhausted through paths 116 and 68, is exhausted by vents 131, allows stable control of the flows inside the chamber process module and promotes containment of the reaction gases in the deposition region 16. Such containment enhances the uniformity of the film deposited on the wafer, and reduces powder build up on the surrounding injector and shield surfaces. The advantageous containment of gases is illustrated in FIG. 26, a schematic diagram showing the mass flow of reactive and inert gases within a portion of the process chamber 111 achieved with the system of the present invention. As shown in the figure, the mass fraction of TEOS (a reactive gas) is shown at various positions within the shield assembly. As shown, the TEOS gas is substantially contained to the deposition region 16, and is completely exhausted through the inner exhaust path 116.

Figure 25:
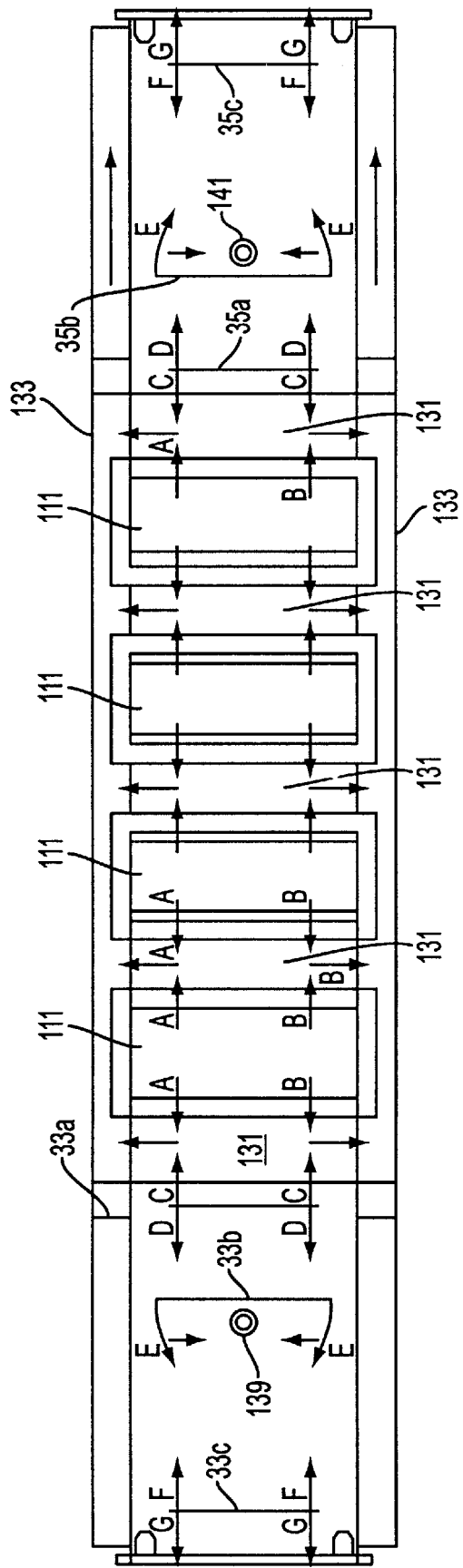
FIG. 25 is a top plan view illustrating the path of various gases as they are exhausted through the CVD system process muffle of FIG. 24.

The by-pass system is shown in greater detail with reference to FIGS. 24b and 25. The by-pass ducts 131 connect each of the buffer modules 127 together into by-pass vents 133 along the full length of the muffle. One by-pass vent 133 is positioned along each end of the by-pass ducts 131. The cavity portion 149 of the by-pass ducts 131 is open at each end of the duct 131 and thus forms a passageway into the by-pass vents 133. Gases flow from the cavity 149 into the by-pass vents 133 positioned at each end of the by-pass duct 131. By separately exhausting the buffer modules 127 via large by-pass ducts 131 and by-pass exhaust vents 133, equalization of pressure and removal of excess inert gas from the buffer modules 127 is enhanced to minimize disturbance of the critical chemical flows inside the chamber process modules 111. Prior art systems which do not vent this region are prone to stagnation and recirculation of gases in the region. This can lead to contamination problems in the system and even in the deposited film, as well as increased maintenance and downtime needed to remove the deposits that form in this region. The present invention minimizes these problems by having continuous purging of the entire wafer substrate path by clean inert gas. Of further advantage, utilizing the by-pass ducts 131 to extract excess inert gas from the process modules allows all the gas flow within the process chambers to be supplied and controlled by the geometry within the chambers, and more effectively isolates the process chambers from any external disturbances or non-uniformity present as in an open APCVD system. This promotes the deposition of more uniform films on the wafers.

In the preferred embodiment, the exhaust vents 32 for each shield assembly and associated process chamber 111 are separately exhausted. Specifically, the exhaust vents 32 are exhausted into a chamber exhaust plenum 151. The chamber exhaust plenum 151 is coupled to each of the process chambers 111. The chamber exhaust plenum 151 is separate from the by-pass exhaust 141b and the load and unload exhausts 139 and 141. By being physically separate, and thus separately controllable, the present invention allows for a constant mass flow of gases from the process chamber 111 into the exhaust vents 32. Preferably the exhaust flow rate is controlled to be a substantially constant rate in the range of approximately 40 to 60 slm through each exhaust vent 32, though other flow rates may be appropriate for different process applications. Maintaining a substantially constant flow rate enhances the controllability of the deposition process on the semiconductor wafer. Specifically, the thickness and uniformity of the layer of material deposited on the surface of the wafer is improved. Additionally, the repeatability of the process is improved since the flow rates are more controllable and constant. Upsets to the process and gas flow rates are minimized. And finally, the longevity of the entire system is increased.

FIG. 25 is a schematic bottom plan view showing the path of the gas flows within exhaust system. Specifically, the gas flow through the by-pass exhaust and the load and unload exhaust flows are shown. The flow of gases through the chamber plenum exhaust is omitted for clarity. Arrows a and B on FIG. 25 represent the gas flow of inert gases, specifically a portion of the inert gases from the bottom outlet screen 160 and from between the chamber process module walls and the vent shroud housing 165, out of the shield assembly and into the buffer module 127 and by-pass ducts 131. As discussed above, and illustrated nicely in FIG. 26, all of the reactant gases flow through the exhaust vents 50 and 32, and do not enter the by-pass duct 131. Thus, only inert gas is conveyed through the by-pass system. The inert gases are conveyed into the by-pass ducts 131 where a substantially equal portion travel toward each end of the by-pass duct 131 and into the by-pass exhaust vents 133 positioned at each end of the duct 131 as represented by Arrows a and B.

In the preferred embodiment, a portion of the gases from the inner load 33A and unload 35A curtains also flow into the outermost by-pass ducts 131, as represented by Arrows C. The remaining portion of the gases flow toward the load and unload exhausts ports 139 and 141, respectively as represented by Arrows D. This bi-directional flow of inert gases from one curtain aids in isolating the process chambers from the load and unload regions. Utilizing a different flow path, the gases from the center load and unload curtains 33B and 35B preferably flow in one direction toward the load and unload ports 139 and 141, respectively as depicted by Arrows E. While the gases from the outer load and unload curtains 33C and 35C are again bi-directional with a portion of the gases being exhausted through their respective exhaust ports 139 and 141 as illustrated by Arrows F, and the other portion flowing toward the entry and exit as represented by Arrows G. Such control of the flow paths of the inert gases allows a "sweeping" of "purging" of the wafer surface, and more importantly, the system of the present invention allows for one to choose the desired direction of the gas flow paths.

Additionally, the system may employ a flow control system to control the flow of gases within the processing chambers. Specifically, the by-pass exhaust vent may be controlled by gas flow control means to provide substantially constant flow of gases exiting the by-pass exhaust vent and the by-pass modules. Further the chamber exhaust plenum may be controlled by gas flow control means to provide substantially constant flow of gases exiting the chamber exhaust plenum and the processing chambers.

As is apparent from the foregoing, the present invention provides a shield 12 which may be used to achieve improved uniformity of reagents within the reaction chamber, greater control over the reaction chemistry residence time, and precise control over the geometry of the reaction chamber 16 and deposition zone, thereby enhancing the quality of the deposited film. The shield 12 can withstand changing temperature conditions without damaging or deforming parts of the shield which could reduce the effectiveness of the shield operation. The shield 12 is modular, and may be conveniently and quickly assembled and dismantled for maintenance or cleaning. The shield 12 includes metering tubes 80, 102 which deliver the inert gas to the plenum in a more uniform distribution, improving the uniformity of the reagents within the deposition zone 16. The shield is used to form a barrier or buffer zone on opposite sides of the reaction chamber, preventing reagents from escaping from the chamber and allowing a uniform distribution of buffer gas to be provided within the muffle 26. It is to be understood that this invention is not limited to the shield 12 of the illustrated embodiment which includes each of the features described herein. Instead, it is to be understood that shields incorporating only some of the features described herein is within the scope of this invention.

It is important to note that while the features of the new embodiment have been described together, each feature may be employed independently and/or in combination with features of the earlier described embodiments. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A protective shield for chemical vapor deposition systems comprising:
   a frame assembly including a pair of spaced end walls and a pair of side walls extending between and mounted to said end walls; and
   first and second injector shield bodies carried by said frame assembly, said injector shield bodies being positioned to define a first surface of said protective shield position able adjacent an injector, said injector shield bodies being spaced apart to define an injection port therebetween for the flow of reagents from the injector through said protective shield, said other shield bodies being contiguous to an associated one of said side walls;
   first and second other shield bodies carried by said frame assembly, said other shield bodies being spaced from said injector shield bodies and positioned to define a second surface of said protective shield opposite said first surface, to define outlet ports therebetween for the flow of reagents through said protective shield;
   said injector shield bodies and said other shield bodies each being formed of a single piece base having a continuous unit frame formed around the perimeter of the base, a perforated sheet carried by said continuous unit frame, a plenum partially defined between said base and said perforated sheet, and a gas delivery device for delivering an inert gas to said plenum at a flow rate such that the gas diffuses through said perforated sheet.

2. The protective shield of claim 1 in which said side walls include a vent shield.

3. The protective shield of claim 1 in which said other shield bodies each include a bottom outlet screen carried in said continuous unit frame and coupled to said plenums thereof for the flow of the inert gas through said other shield bodies to form an inert gas barrier zone below said second surface.

4. The protective shield of claim 1 in which said injector shield bodies and said other shield bodies each have spaced ends and said end walls are shaped to mate with the ends of said injector and other shield bodies to hold said injector and other shield bodies in said frame assembly.

5. The protective shield of claim 4 in which said end walls have recessed regions configured to mate with the ends of said injector and other shield bodies formed therein and the ends of said injector and other shield bodies are seated in said recessed regions, said ends of said injector and other shield bodies being movable within said recessed regions as said injector and other shield bodies expand and contract under varying temperature conditions.

6. The protective shield of claims 1 or 5 in which said perforated sheet is held by said continuous unit frame such that said perforated sheet is movable relative to said continuous unit frame during expansion and contraction of said perforated sheet under varying temperature conditions.

7. The protective shield of claim 6 in which said continuous unit frame has a slot formed therein and said perforated sheet is seated in said slot and movable within said slot during expansion and contraction of said perforated sheet under varying temperature conditions.

8. The protective shield of claim 1 in which said gas delivery device is a metering tube disposed in said plenum, said metering tube having at least one porous wall for diffusion of the gas through said porous wall into said plenum.

9. The protective shield of claim 1 in which in which said gas delivery device is a conduit disposed in said plenum, said conduit extending through one of said end walls and mounted from the exterior thereof to said one of said end walls.

10. The protective shield of claims 8 or 9 in which said end wall includes a gas supply fitting connectable to an exterior gas source and a passageway formed therein for the delivery of the inert gas from said gas supply fitting to said conduit or said metering tube.

11. The protective shield of claims 8 or 9 wherein said conduit or said metering tube includes a flange disposed on at least one end of said metering tube, said flange having a circular recessed region with a plurality of openings disposed around the circumference of said recessed region for distributing gas from the exterior circumference into the interior of the metering tube.

12. The protective shield of claim 1 wherein at least one vent sleeve is positioned along at least one of said side walls for reducing recirculation of the gases as they travel through said exhaust passages.

13. In combination, a chemical vapor deposition system comprising:
   a plurality of processing chambers each having an injector therein for injecting reagents into said processing chambers and exhaust vents positioned on opposite sides of said injector;
   a conveyor for transporting substrates through said processing chambers along a process path;
   a plurality of buffer modules isolating said processing chambers from the rest of the process path;
   a muffle enclosing said processing chambers, said buffer modules and the process path of said conveyor; and
   the protective shield of claim 1.

14. The chemical vapor deposition system of claim 13 wherein said buffer modules each have at least one by-pass duct for the removal of excess gases from said muffle.

15. The chemical vapor deposition system of claim 14 wherein the rate at which the excess gases are removed from the processing chamber through said exhaust vents is less than the rate at which gases are introduced to the processing chambers such that a portion of said inert gas injected through said perforated sheets of said other shield bodies is removed from said muffle through said at least one by-pass duct such that no gas from said buffer modules has to enter said processing chambers.

16. The chemical vapor deposition system of claim 14 wherein each of said at least one by-pass duct are connected to a common by-pass exhaust vent which is independent from said exhaust vents.

17. The chemical vapor deposition system of claim 16 wherein said by-pass exhaust vent is controlled by gas flow control means to provide substantially constant flow of gases exiting said by-pass exhaust vent and said buffer modules.

18. The chemical vapor deposition system of claim 13 wherein each of said exhaust vents are connected to a common chamber exhaust plenum which is independent from the by-pass exhaust vent.

19. The chemical vapor deposition system of claim 18 wherein said chamber exhaust plenum is controlled by gas flow control means to provide substantially constant flow of gases exiting said chamber exhaust plenum and said processing chambers.

20. The chemical vapor deposition system of claim 13 wherein the muffle further includes a load and an unload region positioned at opposite ends of said muffle for receiving and unloading wafers.

21. The chemical vapor deposition system of claim 20 wherein said system includes an elongated buffer module having two elongated baffles positioned adjacent one another forming an elongated slot therebetween, and an open cavity above said slot for receiving said at least one gas, and a bypass plenum disposed at each end of said cavity for exhausting said gas.

22. The chemical vapor deposition system of claim 20 wherein said load and unload regions include:

a plurality of curtains positioned within each of said regions and spaced apart; and one exhaust port in each of said regions for removing gases from said regions.

23. The chemical vapor deposition system of claim 22 wherein each of said exhaust ports include a plenum body with a first plenum stage with a slot in a lower surface for receiving said at least one gas and a second plenum stage with an array of holes in a lower surface for receiving said at least one gas from said first plenum stage for exhausting said gas from said load or unload region.

24. The chemical vapor deposition system of claim 22 wherein each of said curtains include an inlet port for receiving a gas, a plenum body coupled to said inlet port, said plenum body comprised of an upper plenum stage with an array of holes in a lower surface of said upper plenum stage and a lower plenum stage with a slot formed in a lower surface for conveying said gas from said upper plenum stage to said lower plenum stage through said slot and into the muffle.

* * * * *